United States Patent
Boehm et al.

(10) Patent No.: US 11,650,943 B2
(45) Date of Patent: May 16, 2023

(54) FLEXIBLE BUS MANAGEMENT

(71) Applicant: Micron Technology, Inc., Boise, ID (US)

(72) Inventors: Aaron P. Boehm, Boise, ID (US); Scott E. Schaefer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 102 days.

(21) Appl. No.: 16/578,076

(22) Filed: Sep. 20, 2019

(65) Prior Publication Data

US 2020/0117622 A1 Apr. 16, 2020

Related U.S. Application Data

(60) Provisional application No. 62/746,287, filed on Oct. 16, 2018.

(51) Int. Cl.
*G06F 11/00* (2006.01)
*G06F 13/16* (2006.01)
*G06F 11/07* (2006.01)
*G06F 13/38* (2006.01)

(52) U.S. Cl.
CPC ...... *G06F 13/1678* (2013.01); *G06F 11/0727* (2013.01); *G06F 11/0751* (2013.01); *G06F 11/0772* (2013.01); *G06F 13/385* (2013.01)

(58) Field of Classification Search
CPC ............. G06F 11/0727; G06F 11/0751; G06F 11/0772; G06F 13/385; G06F 13/1678
See application file for complete search history.

(56) References Cited

U.S. PATENT DOCUMENTS

| | | | |
|---|---|---|---|
| 2004/0019756 | A1 | 1/2004 | Perego et al. |
| 2008/0162857 | A1 | 7/2008 | Oh |
| 2009/0037647 | A1* | 2/2009 | Sugiyama ........... G06F 11/1044 711/103 |
| 2010/0072284 | A1* | 3/2010 | Nishizawa ............. G06K 19/07 235/492 |

(Continued)

OTHER PUBLICATIONS

"SD Specifications Part 1 Physical Layer Simplified Specification version 6.00" by Technical Committee SD Card Association, Apr. 10, 2017. (Year: 2017).*

(Continued)

*Primary Examiner* — Philip Guyton
(74) *Attorney, Agent, or Firm* — Holland & Hart LLP

(57) ABSTRACT

Methods, systems, and devices for flexible bus management are described. A memory device may transfer data between the memory device and another device (e.g., host device) using a bus including a plurality of data pins. The memory device may transfer data according to a first bus configuration (e.g., according to a first width corresponding to using all of the data pins). After receiving an indication to adjust the configuration, the memory device may adjust the first bus configuration to a second bus configuration where the bus operates according to a second width (e.g., using a subset of the data pins). The memory device may adjust the bus width between the other device and the memory device without adjusting an internal bus width of the memory device (e.g., internal busses that transfer data from the data pins to various components within the memory device).

26 Claims, 14 Drawing Sheets

(56) References Cited

U.S. PATENT DOCUMENTS

| | | |
|---|---|---|
| 2010/0223426 A1 | 9/2010 | Ware et al. |
| 2013/0024585 A1* | 1/2013 | Takahashi ............ G06F 13/4291 |
| | | 710/74 |
| 2013/0117495 A1 | 5/2013 | Rajan et al. |
| 2013/0173974 A1 | 7/2013 | Sul et al. |
| 2014/0157054 A1* | 6/2014 | Yoon ..................... G06F 11/073 |
| | | 714/33 |
| 2015/0026511 A1* | 1/2015 | Loh ..................... G06F 11/0727 |
| | | 714/6.12 |
| 2016/0103778 A1* | 4/2016 | Lesartre .............. G06F 13/1694 |
| | | 711/172 |
| 2016/0170918 A1* | 6/2016 | Butcher .............. H04L 41/0654 |
| | | 710/307 |
| 2016/0179742 A1 | 6/2016 | Nale et al. |
| 2018/0137067 A1 | 5/2018 | Ware et al. |
| 2018/0196767 A1 | 7/2018 | Linstadt |

OTHER PUBLICATIONS

ISA/KR, International Search Report and Written Opinion of the International Searching Authority, Int'l. Appl. No. PCT/US2019/054762, dated Jan. 23, 2020, Korean Intellectual Property Office, Seo-gu, Daejeon, Republic of Korea, 12 pgs.

EPO, Extended European Search Report, EP Appl. No. EP19874196.9, dated Jan. 28, 2022, European Patent Office, 80298 Munich, Germany, 10 pgs.

* cited by examiner

FLEXIBLE BUS MANAGEMENT

CROSS REFERENCE

The present Application for Patent claims priority to U.S. Provisional Patent Application No. 62/746,287 by Boehm et al., entitled "FLEXIBLE BUS MANAGEMENT," filed Oct. 16, 2018, which is assigned to the assignee hereof and is expressly incorporated herein by reference in its entirety.

BACKGROUND

The following relates generally to a system that includes at least one memory device and more specifically to flexible bus management.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Types of memory devices include magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, SRAM, may lose their stored state when disconnected from an external power source. Dynamic memory devices, e.g., DRAM, SDRAM, may lose a stored state over time unless they are periodically refreshed.

In some cases, a memory device (e.g., a DRAM device) may receive commands from an external controller (e.g., a host device) via a bus that includes data pins. In some cases, signals communicated via one or more data pins may become erroneous and no longer reliably transfer data between the external controller and the memory device. For example, a data pin or data channel may experience a short or open preventing reliable data transfer across that data pin or data channel. Improving memory devices, generally, may include increasing memory cell density, increasing read/write speeds, increasing reliability, increasing data retention, reducing power consumption, or reducing manufacturing costs, among other metrics. Improving a memory device's operation based on received commands is desired.

Figure 1:
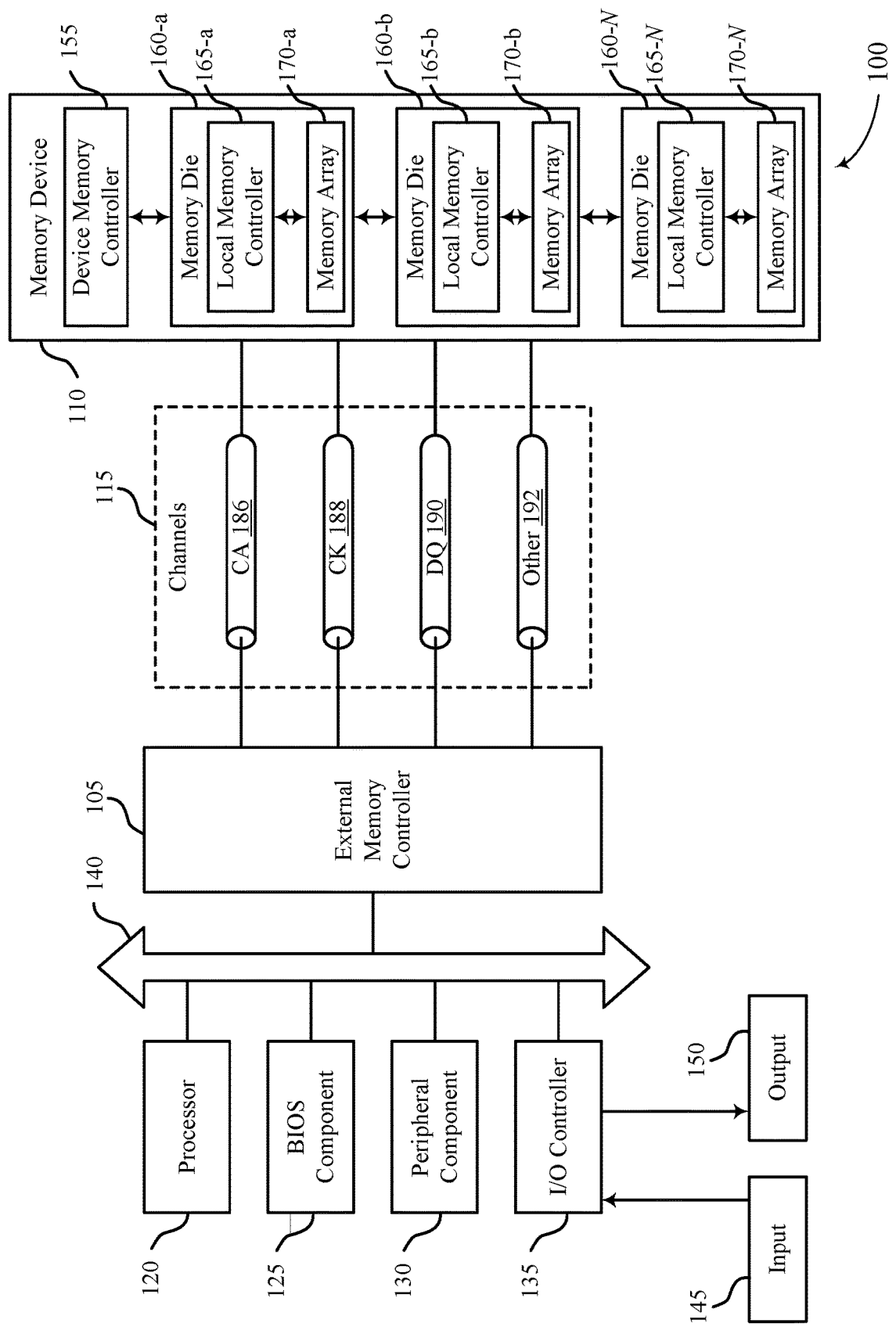
FIG. 1 illustrates an example of a system that supports flexible bus management as disclosed herein.

FIGS. eight (8) and 9 illustrate block diagrams for apparatuses that support flexible bus management as disclosed herein.

FIGS. 10 through 14 illustrate a method or methods that support flexible bus management as disclosed herein.

DETAILED DESCRIPTION

Memory devices may operate under various conditions as part of electronic apparatuses such as personal computers, wireless communication devices, servers, internet-of-things (IoT) devices, electronic components of automotive vehicles, and the like. In some cases, memory devices supporting applications for certain implementations (e.g., automotive vehicles, in some cases with autonomous or semi-autonomous driving capabilities) may be subject to increased reliability constraints. As such, memory devices (e.g., DRAM) for some applications may be expected to operate with a reliability subject to relatively higher industry specifications (e.g., higher reliability constraints).

Some memory device may receive commands from an external controller (e.g., a host device). The commands may indicate a transfer of data between the external controller and the memory device. For example, in a read operation, data may be transferred from the memory device to the external controller while in a write operation, data may be transferred from the external controller to the memory device. The bus between the external controller and the memory device may include a set of data channels coupled to data pins of the memory device. In some cases, one or more data channels or data pins may incur faults and no longer reliably transfer data between the external controller and the memory device. For example, a data pin or data channel may experience a short or open preventing reliable data transfer across that data pin or data channel.

Techniques for flexible bus management to avoid transferring data across faulty data pins or data channels are described. For example, the memory device may operate according to a first bus configuration (e.g., the bus operating according to a first width corresponding to using all of the data pins). The memory device may determine an error associated with one or more data pins or data channels. The memory device may adjust the first bus configuration to a second bus configuration (e.g., in order to avoid transferring data across the one or more faulty data pins or data channels). That is, the memory device may only transfer data using a subset of the data pins. As such, the second bus configuration may include the bus operating according to a second width that is less than the first width. The memory device may adjust the bus width between the external controller and the memory device without adjusting an internal bus width of the memory device (e.g., without adjusting the width of one or more busses that transfer data from the data pins to various components within the memory device as described herein). That is, the memory device may adjust a bus configuration of the memory device in order to avoid transferring data across faulty data pins or data channels, thus improving the reliability of the memory device.

Features of the disclosure are initially described in the context of a memory system and device with reference to FIGS. 1, 2, 3, and 4. Features of the disclosure are described in the context of a process flow with reference to FIGS. 5, 6, and 7. These and other features of the disclosure are further illustrated by and described with reference to apparatus diagrams and flowcharts in FIGS. 8-14 that relate to flexible bus management.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some examples, system 100 is a graphics card. In some cases, the host device may refer to the hardware, firmware, software, or a combination thereof that implements the functions of the external memory controller 105. In some cases, the external memory controller 105 may be referred to as a host or host device.

In some cases, the memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any number of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the number of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120).

In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any number of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, a number of signal paths in data channels 190 (e.g., a data bus) may correspond to the width of the data channels 190. The device memory controller 155 may support a flexible data bus width. For example, the memory device 110 may operate according to a first data channel configuration (e.g., the data bus operating according to a first width corresponding to using all of the data channels 190). The device memory controller 155 may indicate to adjust the first data channel configuration to a second data channel configuration. That is, the memory device 110 may only transfer data using a subset of the signal paths of data channels 190. As such, the second data channel configuration may correspond to the data bus operating according to a second width that is less than the first width.

In some cases, the channels 115 may include one or more other channels 192 that may be dedicated to other purposes. These other channels 192 may include any number of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any number of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any number of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
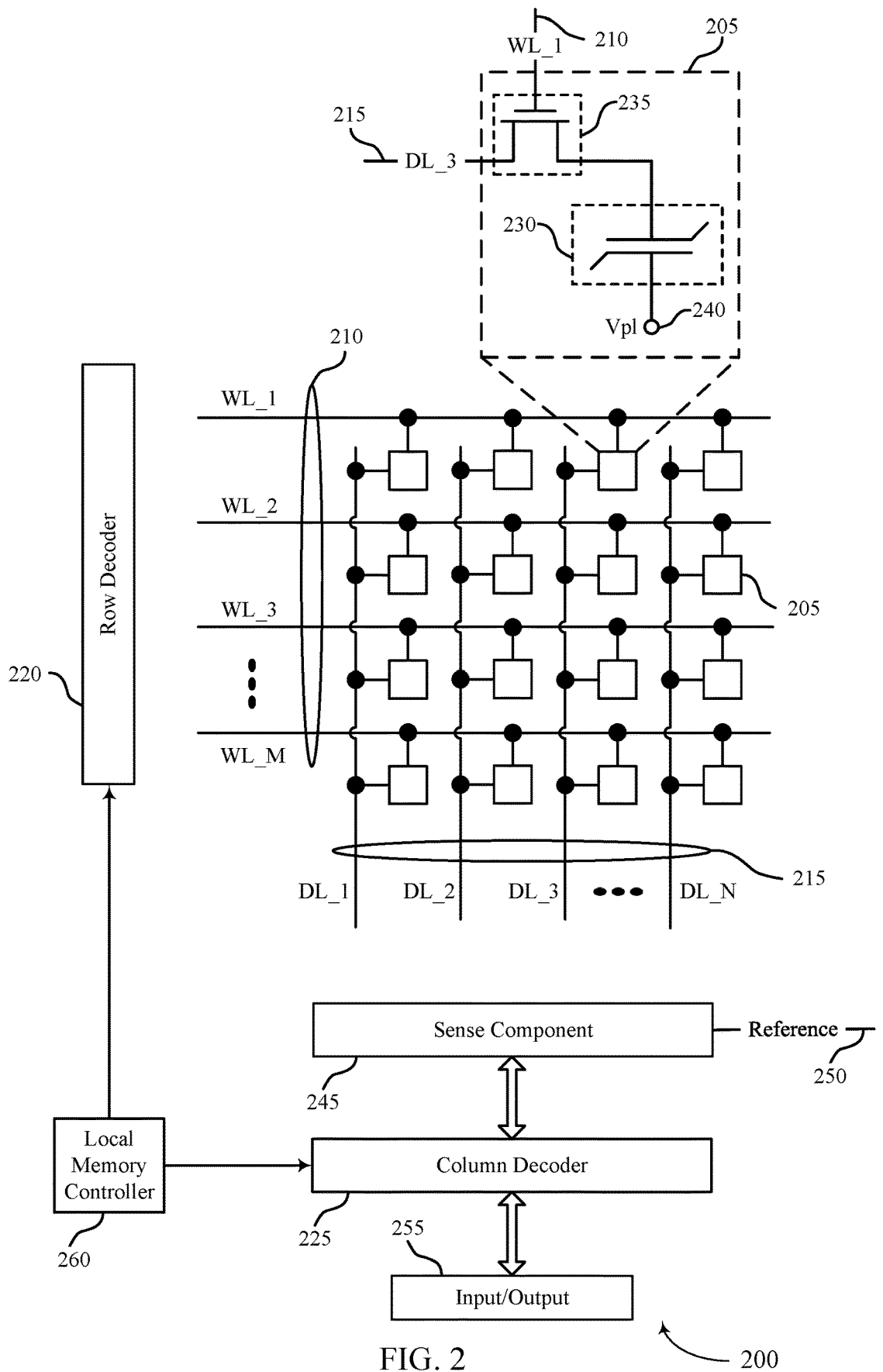
FIG. 2 illustrates an example of a memory sub-array that supports flexible bus management as disclosed herein.

FIG. 2 illustrates an example of a memory sub-array 200 in accordance with various examples of the present disclosure. The memory sub-array 200 may be an example of at least a portion of the memory dies 160 described with reference to FIG. 1. In some cases, the memory sub-array 200 may be referred to as a memory die, memory chip, a memory device, or an electronic memory apparatus. For example, a memory device such as a memory chip may include multiple instances of memory sub-array 200, with additional row, address, bank, or bank group decoding used to select one or more sub-arrays from the multiple instances for access operations. The memory sub-array 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line or configuring a multiplexer to map the line to a given signal.

The memory sub-array 200 may include the access lines (e.g., the word lines 210 and the digit lines 215) arranged in a grid-like pattern. Memory cells 205 may be positioned at intersections of the word lines 210 and the digit lines 215. By biasing a word line 210 (e.g., applying a voltage to the word line 210), a memory cell 205 may be accessed via the digit line 215 at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may select a digit line 215 based on the received column address. For example, the memory sub-array 200 may include multiple word lines 210, labeled WL_1 through WL_M, and multiple digit lines 215, labeled DL_1 through DL_N, where M and N depend on the size of the memory array. Thus, by activating a word line 210, e.g., WL_1, the memory cells 205 in a given row may be accessed. The digit lines 215 (e.g., DL_1, . . . DL_N) carry the data for writing or reading from the memory cells in the row. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., via charge sharing) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include amplifiers (e.g., transistor amplifiers) to detect and amplify a difference in the signals. The detected logic state of memory cell 205 may be output through column decoder 225 as output 255. In some cases, the aspects of sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, aspects of the row decoder 220, column decoder 225, or sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory sub-array 200, perform one or more operations on the memory sub-array 200, and communicate data from the memory sub-array 200 to the external memory controller 105 (or the device memory controller 155) in response to performing the one or more operations. In some cases, data may be communicated from the memory sub-array 200 to the device memory controller 155 according to a prefetch width. The prefetch width may be a function of the data bus width. For example, the prefetch width may be given by Xn, where X is a multiplier (e.g., 2, 4, 8, 16), and n is the data bus width. The multiplier X may, for example, equal a burst length for accesses to the memory sub-array 200. In some cases, the prefetch width may be static (e.g., a hardwired characteristic of the memory device).

The device memory controller 155 may indicate a bus width for data communications between the memory device and an external memory controller (e.g., a host device). In some cases, this bus width may be variable. For example, a maximum bus width for data communications between the memory device and the external memory controller may correspond to using each of the possible signal paths (e.g., using each available data pin). In some cases, the device memory controller 155 may indicate for a subset of the signal paths to be used (e.g., corresponding to a subset of the data pins being used). In some cases, this may allow the device memory controller 155 to avoid data pins and/or signal paths that may be faulty. In some cases, the prefetch width may not change when a subset of the signal paths is used (e.g., may be determined based on the maximum or full bus width).

The local memory controller 260 may generate row and column address signals to activate the target word line 210 and select the target digit line 215. The local memory controller 260 may also generate and control various voltages or currents used during the operation of the memory sub-array 200. In general, the amplitude, shape, or duration of an applied voltage or current discussed herein may be adjusted or varied and may be different for the various operations discussed in operating the memory sub-array 200.

In some cases, the local memory controller 260 may be configured to perform a write operation (e.g., a programming operation) on one or more memory cells 205 of the memory sub-array 200. During a write operation, a memory cell 205 of the memory sub-array 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 (e.g., applying a voltage to the word line 210), to access a row including the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory sub-array 200. During a read operation, the logic state stored in a memory cell 205 of the memory sub-array 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 (e.g., applying a voltage to the word line 210), to access a row including the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation (e.g., by selecting data read from digit lines 215 using column decoder 225).

The row access logic and the column access logic may determine a subset of the array corresponding to the target memory cell 205. That is, the row access logic and the column access logic may be configured to determine the word line or lines 210 activated during the read operation and the digit line or lines 215 carrying the data associated with the read operation. The row access logic and the column access logic may transmit an indication of the determined subset of the array (e.g., to a verifier as discussed herein). In some examples, the indication of the subset of the array may indicate the subset along one or more dimensions of the array. For example, the indication of the subset of the array may indicate the word line or lines 210 being activated during the read operation (e.g., a row MAT indication). Additionally or alternatively, the indication of the subset of the array may indicate the digit line or lines 215 selected during the read operation (e.g., a column MAT indication).

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
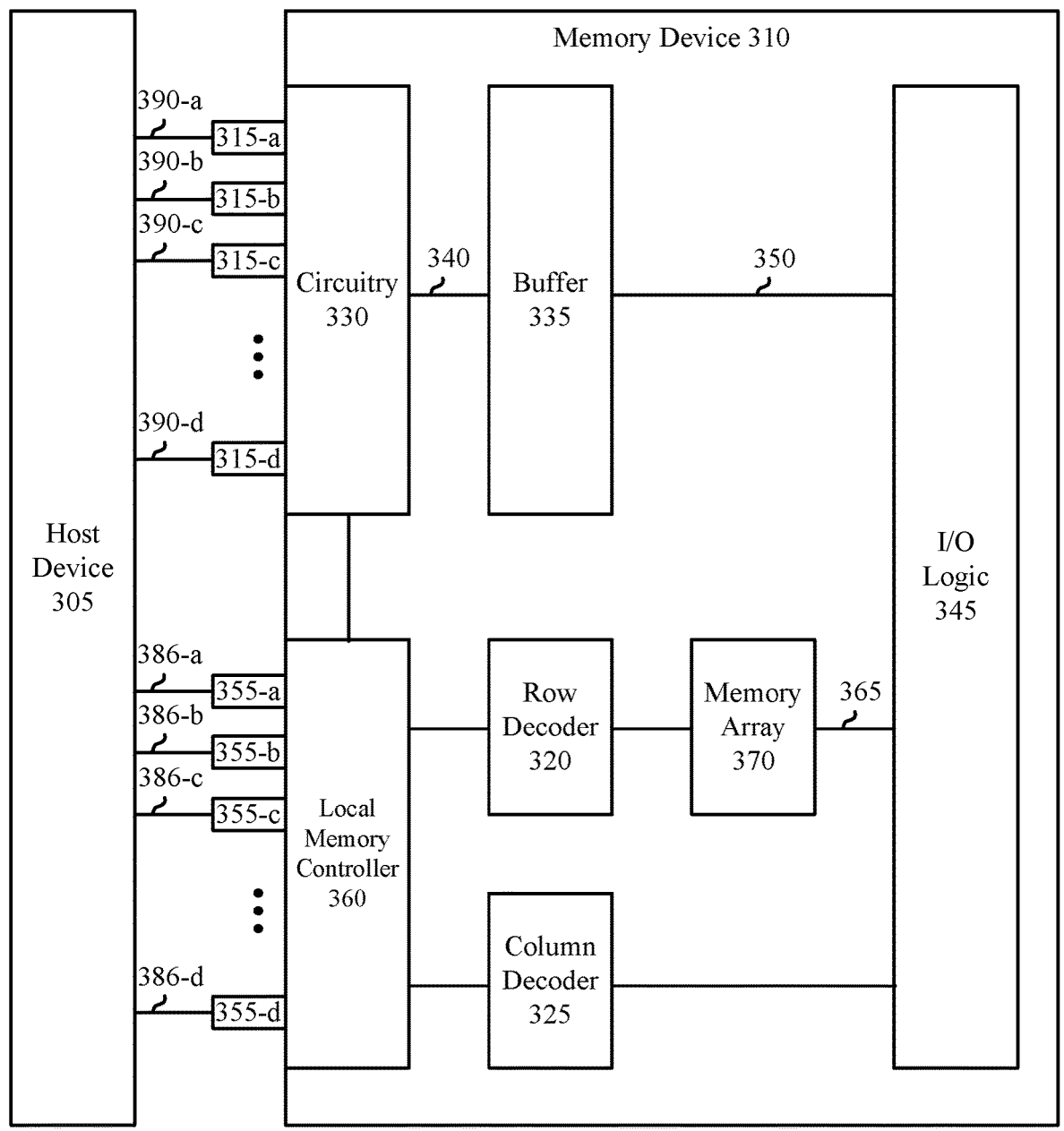
FIG. 3 illustrates an example of a system that supports flexible bus management as disclosed herein.

FIG. 3 illustrates an example of a system 300 that supports techniques for flexible bus management. The system 300 may include one or more components described herein with reference to FIGS. 1 and 2. For example, the system 300 may include a host device 305, which may be an example of the external memory controller 105 as described with reference to FIG. 1 and a memory device 310, which may be an example of the memory device 110, the memory dice 160, or the memory sub-array 200 as described with reference to FIGS. 1 and 2. The memory device 310 may include a memory array 370, which may be an example of the memory arrays 170 as described with reference to FIG. 1. The memory device 310 may include local memory controller 360 which may be an example of the device memory controller 155, the local memory controller 165, or the local memory controller 260 as described with reference to FIGS. 1 and 2. The memory device may further include a row decoder 320 and column decoder 325, which may be examples of the row decoder 220 and the column decoder 225 respectively as described with reference to FIG. 2. The memory device 310 may also include data channels 390, data pins 315, CA channels 386, CA pins 355, circuitry 330, buffer 335, and input/output (I/O) logic 345.

Host device 305 may send commands to memory device 310 via the CA channels 386. The commands may include an instruction (e.g., a read instruction, a write instruction, a refresh instruction, etc.) and an address (e.g., row address, column address). In some instances, the command may include a data transfer operation. For example, in a read operation, data may be transferred from the memory array 370 to the host device 305. In another example, data may be transferred from the host device 305 to the memory array 370 in a write operation. The data may be transferred (between the host device 305 and the memory device 310) via the data channels 390 and data pins 315. In some cases, the data pins 315 or data channels 390 may be faulty (e.g., may be shorted, may be open, may be cross-coupled). In these cases, the memory device 310 may deactivate one or more data pins 315 (e.g., the faulty data pin 315 included in the one or more deactivated data pins 315) in order to transfer data without relying on the faulty data pin 315 or data channel 390. That is, a number of active data pins 315 (e.g., pins that transfer data) may be variable.

The local memory controller 360 may receive a command via the CA pins 355 and determine an instruction and a row and/or column address corresponding to the received command. The local memory controller 360 may transmit the instruction and a determined row address to the row decoder 320 and transmit a determined column address to the column decoder 325. The row decoder 320 may activate a word line of the memory array 370 corresponding to the determined row address (e.g., the row decoder 320 may initiate a row access strobe). In some cases, the activated row may correspond to a page of data (e.g., 4096 bits, 8192 bits, 16384 bits) to be transmitted to the I/O logic 345 via bus 365. The bus 365 may include one or more data lines in parallel. For example, the bus 365 may include a number of data lines corresponding to a number of bits within a page of the memory array 370. In one example, if a page of data stored by memory array 370 includes 4096 bits, the bus 365 may include 4096 data lines running in parallel between the memory array 370 and the I/O logic 345 (e.g., the width of the bus 365 may be 4096 bits). These numbers are exemplary and for illustrative clarity only, and it is to be understood that the size of a page of data and a number of data lines may be any number. In some cases, the bus 365 may be bi-directional (e.g., may carry data both to the memory array 370 and from the memory array 370). In another example, the bus 365 may include two sets of data lines, where each set of data lines carries data either from the I/O logic 345 to the memory array 370 or from the memory array 370 to the I/O logic 345.

In some cases (e.g., in the case that the command further indicates a column address such as during a column access strobe), the column decoder 325 may indicate digit lines of the memory array 370 (e.g., via the I/O logic 345). Here, the column decoder 325 may select a portion of the page of data relevant to the command (e.g., corresponding to the data stored at an intersection of the word line and the digit lines). In some cases, this may be a smaller amount of data than is stored in a page of data (e.g., 128 bits, 256 bits, 512 bits). For example, the column decoder may act to select 128 bits of data from a 4096 bit page of data. This portion of data may be transferred between the I/O logic 345 and the buffer 335 via bus 350. The bus 350 may include one or more data lines in parallel. In some cases, the bus 350 may include a number of data lines corresponding to a number of bits within the portion of data. For example, in the case that a portion of data addressed by the column decoder 325 corresponds to 256 bits, the bus 350 may include 256 data lines running in parallel between the buffer 335 and the I/O logic 345 (e.g., the width of the bus 350 may be 256 bits). The width of the bus 350 may correspond to a prefetch width for the memory device 310. That is, the width of the bus 350 may correspond to an amount of data that is transferred at a time during an access instruction execution (e.g., a read instruction, a write instruction, a refresh instruction). In some cases, the bus 350 may be bi-directional (e.g., may carry data both from the I/O logic 345 to the buffer 335 and from the buffer 335 to the I/O logic 345). In another example, the bus 350 may include two sets of data lines, where each set of data lines carries data either from the I/O logic 345 to the buffer 335 or from the buffer 335 to the I/O logic 345.

The buffer 335 may transfer data between the memory array 370 (e.g., via I/O logic 345) and the host device 305 (e.g., via the bus 340, circuitry 330, and data pins 315). The number of data pins 315 used by the memory device 310 to transfer data between the host device 305 and the memory device 310 may be variable. A data pin 315 that is being used to transfer data between the host device 305 and the memory device 310 may be referred to as an active data pin 315. In some cases, the number of active data pins 315 may correspond to the total number of data pins 315 at the memory device 310 (e.g., each of the data pins 315 may be active). In some other cases, only a subset of the data pins 315 may be active (e.g., data pins 315-*a* and 315-*c* may be active while data pins 315-*b* and 315-*d* may not be active). For example, the memory device 310 may have sixteen (16) data pins 315 and sixteen (16) data lines (e.g., of the bus 340) for transferring data between the data pins 315 and the buffer 335. Here, the bus width for communications between the host device 305 and the memory device 310 may be sixteen (16) bits (e.g., corresponding to each of the data channels 390). However, the memory device 310 may utilize a subset (e.g., 15 or less) of the data pins 315 for data transfers.

The variable number of active data pins 315 may correspond to a variable bus width for communications between the host device 305 and the memory device 310. That is, if each of the data pins 315 are active, each of the data channels 390 may be used to transfer data (e.g., corresponding to a first bus width). In the event that a subset of the data pins 315 are active, a corresponding subset of the data channels 390 may be used to transfer data (e.g., corresponding to a second bus width that is smaller than the first bus width).

The number of bits transmitted via the data pins 315 for an access operation (e.g., a burst length) may be based on the number of data pins 315 that are active. For example, the buffer 335 may store data corresponding to the prefetch width (e.g., 128 bits of data in the case that 128 bits are transmitted via the bus 350). In the case that the memory device 310 has sixteen (16) data pins 315, and each of the data pins 315 are active, the data pins 315 may each transfer eight (8) bits of data (e.g., serially) between the host device 305 and the memory device 310 (e.g., corresponding to a burst length of eight (8)). Alternatively, if only half of the data pins 315 (and corresponding data lines of bus 340) are active (e.g., eight (8) of the 16), each data pin 315 may transfer sixteen (16) bits of data (e.g., serially) between the host device 305 and the memory device 310 (e.g., corresponding to a burst length of sixteen (16)). In some cases, the clock rate at the data pins 315 may be consistent regardless of the number of active data pins 315. That is, in the event that a subset of the data pins 315 are active (e.g., one or more of the data lines of bus 340 and data pins 315 are inactive), the time it takes to relay data between the host device 305 and the buffer 335 may increase relative the time it takes to relay data between the host device 305 and the buffer 335 when all of the data pins 315 are active. That is, the bandwidth of the memory device 310 may decrease as the number of active data pins 315 decreases.

The buffer 335 may buffer data for a time that is dependent on the number of active data pins 315. For example, the buffer 335 may be configured to transfer a set number of bits between the host device 305 and the I/O logic 345. In the event that all of the data pins 315 are active, the buffer 335 may transmit/receive (e.g., corresponding to a read/write instruction) bits of data for a first number of cycles. For example, the buffer 335 may receive 512 bits from the I/O logic 345 as part of a read operation. In the event that 32 data pins 315 are active, the buffer 335 may output the 512 bits over sixteen (16) cycles, each of 32 bits (a bus width of thirty-two (32) and burst length of sixteen (16)) to the host device 305. That is, the buffer 335 may transmit data over sixteen (16) cycles of the burst (e.g., sixteen (16) clock cycles using one clock transition or eight (8) clock cycles using each transition of a clock signal). In a write operation, the buffer 335 may receive 512 bits from the host device 305. In the event that 32 data pins 315 are active, the buffer 335 may receive the 512 bits over sixteen (16) cycles, each of 32 bits (a bus width of 32 and a burst length of sixteen (16)) from the host device 305. That is, the buffer 335 may aggregate 32 streams of data received over sixteen (16) clock cycles. The buffer 335 may transmit the 512 bits (e.g., in parallel) to the I/O logic 345 for writing to the memory array 370.

However, in the event that a subset of the data pins 315 are active, the buffer 335 may transmit/receive (e.g., corresponding to a read/write instruction) a different number of bits of data on each cycle for a second number of clock cycles. For example, the buffer 335 may have received the 512 bits from the I/O logic 345 as part of the read operation. Here, only sixteen (16) data pins 315 (e.g., from the 32 data pins 315) may be active. The buffer 335 may output (e.g., via the circuitry 330 and data pins 315) sixteen (16) bits of data for each burst cycle of a burst length of 32 to the host device 305. That is, the buffer 335 may transmit data over 32 cycles of the burst (e.g., 32 clock cycles using one clock transition or sixteen (16) clock cycles using each transition of a clock signal). In a write operation, the buffer 335 may receive 512 bits of data from the host device 305. Here, only sixteen (16) data pins 315 (e.g., from the 32 data pins 315) may be active. The buffer 335 may receive the 512 bits over 32 cycles, each of sixteen (16) bits (a bus width of sixteen (16) and a burst length of 32) from the host device 305. That is, the buffer 335 may aggregate sixteen (16) streams of data received over 32 clock cycles. The buffer 335 may transmit the 512 bits (e.g., in parallel) to the I/O logic 345 for writing to the memory array 370.

The circuitry 330 may configure the buffer 335, bus 340 (and corresponding data lines), and data pins 315 to operate according to a specified number of active data pins 315. In some cases, the circuitry 330 may provide an indication to the buffer 335 of an active number of data pins 315 and a burst length. In a first example, the circuitry 330 may indicate to the buffer 335 that each of the data pins 315 are active and the data is transferred according to a first burst length. Here, the buffer 335 may utilize each of the data lines of the bus 340 (e.g., corresponding to a first width) to transfer data between the circuitry 330 and the buffer 335. In a second example, the circuitry 330 may indicate to the buffer 335 that only a subset of the data pins 315 are active and the data is transferred according to a second burst length. Here, the buffer 335 may utilize a subset of data lines of the bus 340 (e.g., as indicated by the circuitry 330 and corresponding to a second width) to transfer data between the circuitry 330 and the buffer 335. The subset of the data pins 315 may be any intermediate number of the total number of data pins 315 at the memory device 310. For example, a subset of sixteen (16) total data pins 315 may include a single active data pin 315 all the way to 15 active data pins. The burst length may change according to the number of active data pins 315. In some cases, the number of bits output by each data pin 315 may be the same (e.g., eight data pins 315 each outputting sixteen (16) bits of data to output a total of 128 bits). In some other cases, the number of bits output by each data pin 315 may be variable (e.g., 12 data pins 315 each outputting either 10 or 11 bits of data). Here, a data pin 315 may output a null data bit during the last clock cycle (e.g., a data pin 315 outputting 10 bits of data may output a null data bit during the 11th cycle).

The circuitry 330 may include components to control a mapping between the data pins 315 and the memory array 370 (e.g., control the data flow between the data pins 315 and the buffer 335). For example, the circuitry 330 may include switching circuitry between the data pins 315 and the bus 340 (e.g., a cross-point switch). In the event that a subset of the data pins 315 are active (e.g., one or more data pins 315 is not active), the circuitry 330 may switch the data between the active signals of the bus 340 and the active data pins 315.

The circuitry 330 may receive an indication of the active data pins 315 from the local memory controller 360. The circuitry 330 may receive the indication via a mode register (e.g., regarding a serial mode). That is, the local memory controller 360 may set a mode register to store the indication of the active data pins 315. The local memory controller 360 may indicate a configuration for the active data pins 315 (e.g., via an index). For example, a first configuration may indicate that each of the data pins 315 are active, a second configuration may indicate that a first half of the data pins 315 are active, and a third configuration may indicate that a second half of the data pins 315 are active. The configurations may be more granular (e.g., may indicate active pins according to thirds, quarters, eighths, etc.). For instance, an index may indicate a configuration where a first quarter and a third quarter of the data pins 315 are active. In another example, the local memory controller 360 may explicitly indicate to the circuitry 330 the data pins 315 that are active (and the data pins 315 that are inactive). In some cases, the prefetch width and/or page width is the same for each of the configurations.

The set of data pins 315 that are active may be based on an error associated with one or more data pins 315. That is, in the event that data pin 315-a is experiencing an error (e.g., a short), the active set of data pins 315 may not include the data pin 315-a. In some cases, the local memory controller 360 may determine an error associated with one or more data pins 315. In some cases, the local memory controller 360 may use data collected by the circuitry 330 or buffer 335 in order to determine the error. For example, the circuitry 330 or buffer 335 may detect a short, open, or cross-coupling on a data pin 315. In a first case, the circuitry 330 or buffer 335 may detect a short on the data pin 315 by detecting that a voltage on the data pin 315 (e.g., a driven state of the data pin 315) is not the same as the output between the circuitry 330 and the buffer 335 (e.g., the intended driven state based on the state of the corresponding signal in bus 340). In a second case, the circuitry 330 may include current sensing circuitry. Here, the circuitry 330 may determine opens, shorts, or cross-coupling using the current sensing circuitry applied to the data pins 315. In another case, the host device 305 may indicate to the local memory controller 360 an error associated with the one or more data pins 315. For example, the host device 505 may detect a short on the data pin 315 by detecting that a voltage on the data pin 315 (e.g., a driven state of the data pin 315) is not the same as the desired output from the host device 305. Additionally or alternatively, the host device 305 may include current sensing circuitry. Here, the host device 305 may detect a short at the data pin 315 by determining opens/shorts using the current sensing circuitry relative to the data pin 315. That is, the host device 305 may measure each data channel using voltage sensing or current sensing to detect opens/shorts. In some cases, the host device 305 may detect faulty data pins 315 or data channels 390 based on patterns of data received from the memory device 310 over the data channels 390 (e.g., data written to the device at an address does not match data read from the address).

The local memory controller 360 may determine a set of active data pins 315 (e.g., corresponding to the configuration for the active data pins 315) based on an error detected by the memory device 310 or the host device 305. Additionally or alternatively, the host device 305 may determine a configuration for the data pins 315 that are active. Here, the host device 305 may indicate the configuration to the local memory controller 360. The local memory controller 360 may store the configuration indication at the mode register. Thus, the memory system 300 may increase reliability by configuring an active set of data pins 315 based on detected errors associated with one or more data pins 315.

Figure 4A:
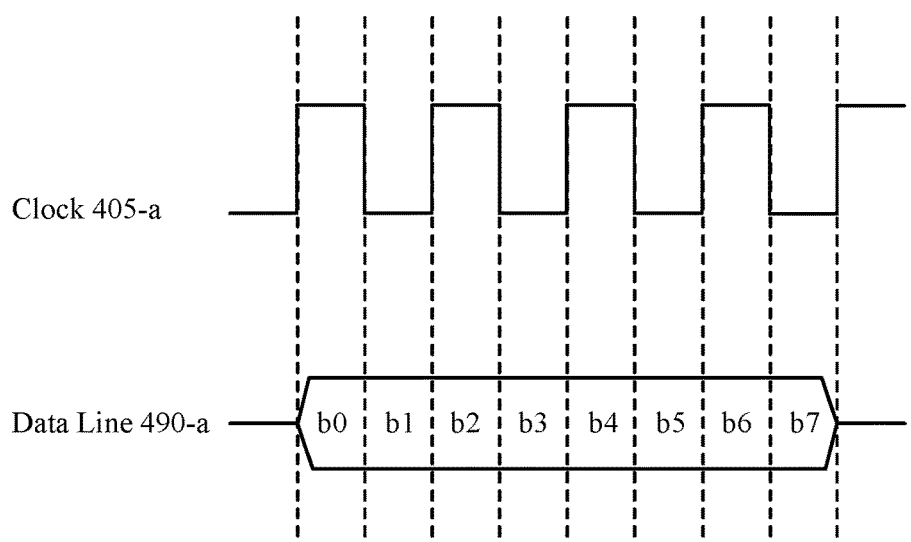
FIGS. 4A and 4B illustrate examples of timing diagrams that support flexible bus management as disclosed herein.
Figure 4B:
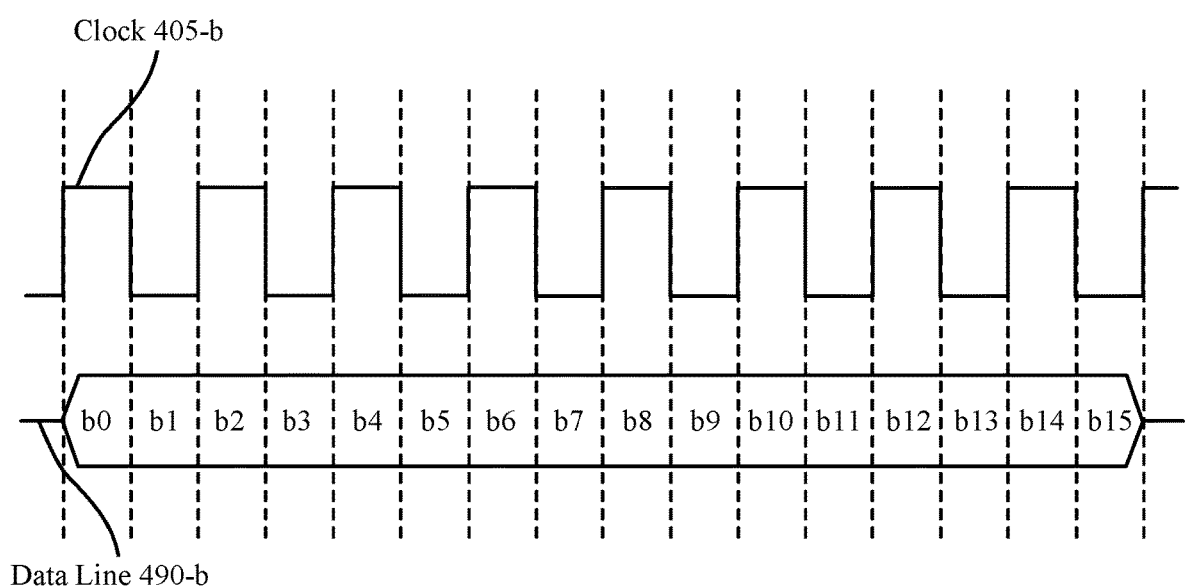

FIGS. 4A and 4B illustrate examples of timing diagrams 400 that support techniques for flexible bus management. The timing diagrams 400 may illustrate aspects described herein with reference to FIGS. 1, 2, and 3. For example, the timing diagrams 400 may include data lines 490 which may be examples of data channels 190 and data channels 390 as discussed with reference to FIGS. 1 and 3. The timing diagrams 400 may further include clock signals 405. In some cases, timing diagram 400-a and timing diagram 400-b may illustrate a signal on a data line 490 over the clock signals 405. The data lines 490 may transfer data between a host device (e.g., host device 305 as described with reference to FIG. 3) and a data pin of a memory device (e.g., memory device 310 as described with reference to FIG. 3). Timing diagrams 400-a and 400-b may illustrate data transfers between a same host device and a memory device where the memory device is utilizing a different number of active data pins in timing diagram 400-a than in timing diagram 400-b. In some cases, data line 490-a and data line 490-b may be a same data line 490, but with data line 490-a illustrating the operation of the data line 490 where the memory device is utilizing a first number of active data pins (first bus width) and data line 490-b illustrating the operation of the data line 490 where the memory device is utilizing a second number of active data pins (second bus width). Further, data line 490-a may illustrate the operation of the data line 490 where the memory device is utilizing the first bus width and a first burst length, and data line 490-b may illustrate the operation of the data line 490 where the memory device is utilizing a second bus width (e.g., a smaller bus width) and a second burst length (e.g., a larger burst length).

FIG. 4A may illustrate data line 490-a transferring data between an active data pin and the host device using a burst length of eight (8). Here, the data line 490-a may be outputting a bit every transition of the clock signal 405-a (e.g., double data rate), thus outputting bits b0 through b7 within four (4) clock cycles. However, in some other examples (not shown), the data line 490-a may output a bit every clock cycle (e.g., corresponding to a rising and falling edge of the clock signal 405-a). In such other examples, the data line 490-a may output bits b0 through b7 within eight (8) clock cycles.

In some cases, data line 490-*a* may be one of many data lines each coupled with an active data pin. For example, data line 490-*a* may be one of sixteen (16) data lines 490 transferring data between an active data pin and the host device using a burst length of eight (8). The sixteen (16) data lines 490-*a* thus may be outputting a total of 128 bits within four (4) clock cycles.

FIG. 4B may illustrate data line 490-*b* transferring data between an active data pin and the host device using a burst length of sixteen (16). Here, the data line 490-*b* may be outputting a bit every transition of the clock signal 405-*b*, thus outputting bits b0 through b15 within eight (8) clock cycles. However, in some other examples, the data line 490-*b* may output a bit every clock cycle (e.g., corresponding to a rising and falling edge of the clock signal 405-*b*). In such other examples, the data line 490-*b* may output bits b0 through b15 within sixteen (16) clock cycles.

In some cases, data line 490-*b* may be one of many data lines each coupled with an active data pin. The number of data lines 490-*b* coupled with an active data pin may be less than the number of data pins on the memory device, which may be less than in the context of FIG. 4A. As a result, the number of bits transmitted by each data line 490-*b* may increase. For example, in FIG. 4B, the memory device may have sixteen (16) data pins but may only have eight (8) active data pins. When each of the data pins are active (e.g., according to timing diagram 400-*a*), data line 490-*a* may output information using a burst length of eight (8) (e.g., to output 128 bits collectively within four (4) clock cycles in a DDR configuration). However, with only eight (8) active data pins (e.g., according to timing diagram 400-*b*), data line 490-*b* may output information using a burst length of sixteen (16) (e.g., to output 128 bits collectively eight (8) clock cycles in a DDR configuration).

In another example, the memory device may have 32 data pins of which only 17 may be active. When each of the data pins are active (e.g., according to timing diagram 400-*a*), data line 490-*a* may transmit eight (8) bits of data (e.g., to output 256 bits collectively within four (4) clock cycles in a DDR configuration, using a burst length of eight (8)). When only 17 of the 32 data pins are active (e.g., according to timing diagram 400-*b*), the data line 490-*b* may transmit either fifteen (15) or sixteen (16) bits of data in the burst, using a burst length of fifteen (15) or sixteen (16). In a first instance, the data line 490-*b* may transmit sixteen (16) data bits at b0 through b15. In a second instance, the data line 490-*b* may transmit fifteen (15) data bits at b0 through b14. At b15, the data line 490-*b* may transmit a null data bit.

Figure 5:
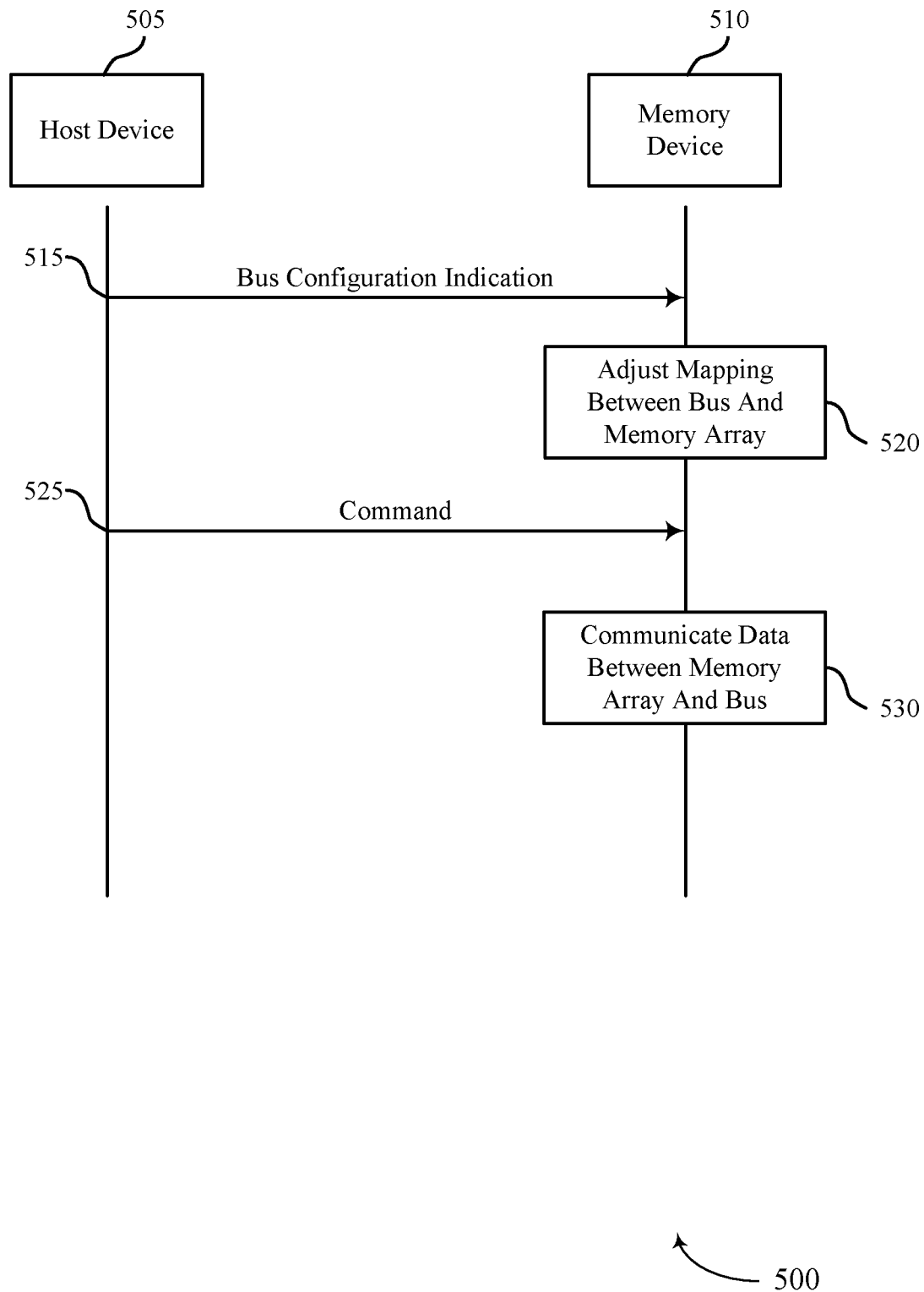
FIGS. 5 through 7 illustrate process flows that support flexible bus management as disclosed herein.

FIG. 5 illustrates an example of a process flow 500 that supports techniques for flexible bus management. In some examples, process flow 500 may be implemented by aspects of the systems 100 and 300, memory sub-array 200, and timing diagrams 400. The process flow 500 may include operations performed by a host device 505, which may be an example of the host device described with reference to FIGS. 1 and 3. The memory device 510 may be an example of a memory device (e.g., the memory device 110, the memory dice 160, the memory sub-array 200, or the memory device 310) as described with reference to FIGS. 1 through 3.

At 515, the memory device 510 may receive, while in a first configuration for a bus, an indication of a change from the first configuration to a second configuration for the bus. In some cases, the second configuration may be one of a plurality of configurations supported by the memory device 510, where each configuration of the plurality of configurations may be associated with a different subset of channels of the bus. In some cases, each channel of the bus may interface with the memory device 510 via a data pin.

At 520, the memory device may adjust a mapping between a memory array of the memory device and the bus based on the second configuration, the bus having a first width in the first configuration and a second width in the second configuration. In some examples, the first width may correspond to a first quantity of channels of the bus being active and the second width corresponds to a second quantity of channels of the bus being active.

At 525, the memory device 510 may receive, while in the second configuration, a command from the host device 505 for access to the memory array. In a first example, the memory device 510 may receive, while in the second configuration, a read command for a memory address from the host device 505. The memory device 510 may prefetch, for the read command, data having a third width from the memory address, where the third width is common to prefetches in the first configuration and in the second configuration. The memory device 510 may convert the data having the third width into multiple sets of data having the second width.

In a second example, the memory device 510 may receive, while in the second configuration, a write command for a memory address from the host device 505. The memory device 510 may further receive, for the write command, multiple sets of data having the second width sequentially over the subset of channels. Here, the write command may be associated with a second burst length that is different from a first burst length (e.g., the first burst length associated with write commands in the first configuration). The memory device 510 may aggregate the multiple sets of data having the second width into data having a third width.

At 530, the memory device 510 may communicate, while in the second configuration and in response to the command, data between the memory array and a subset of channels of the bus, the subset of channels having the second width. During an execution of a read command, the communicating data between the memory array and the subset of channels of the bus may include the memory device outputting the multiple sets of data (e.g., the multiple sets of data converted from the third width) having the second width sequentially to the host device 505 over the subset of channels. Here, the multiple sets of data having the second width may correspond to a second burst length that is different from first burst length (e.g., the first burst length being the burst length associated with read commands in the first configuration). During an execution of a write command, the communicating data between the memory array and the subset of channels of the bus may include the memory device 510 writing the data having the third width (e.g., as resulting from the memory device 510 aggregating the multiple sets of data having the second width) to the memory array at the memory address.

Figure 6:
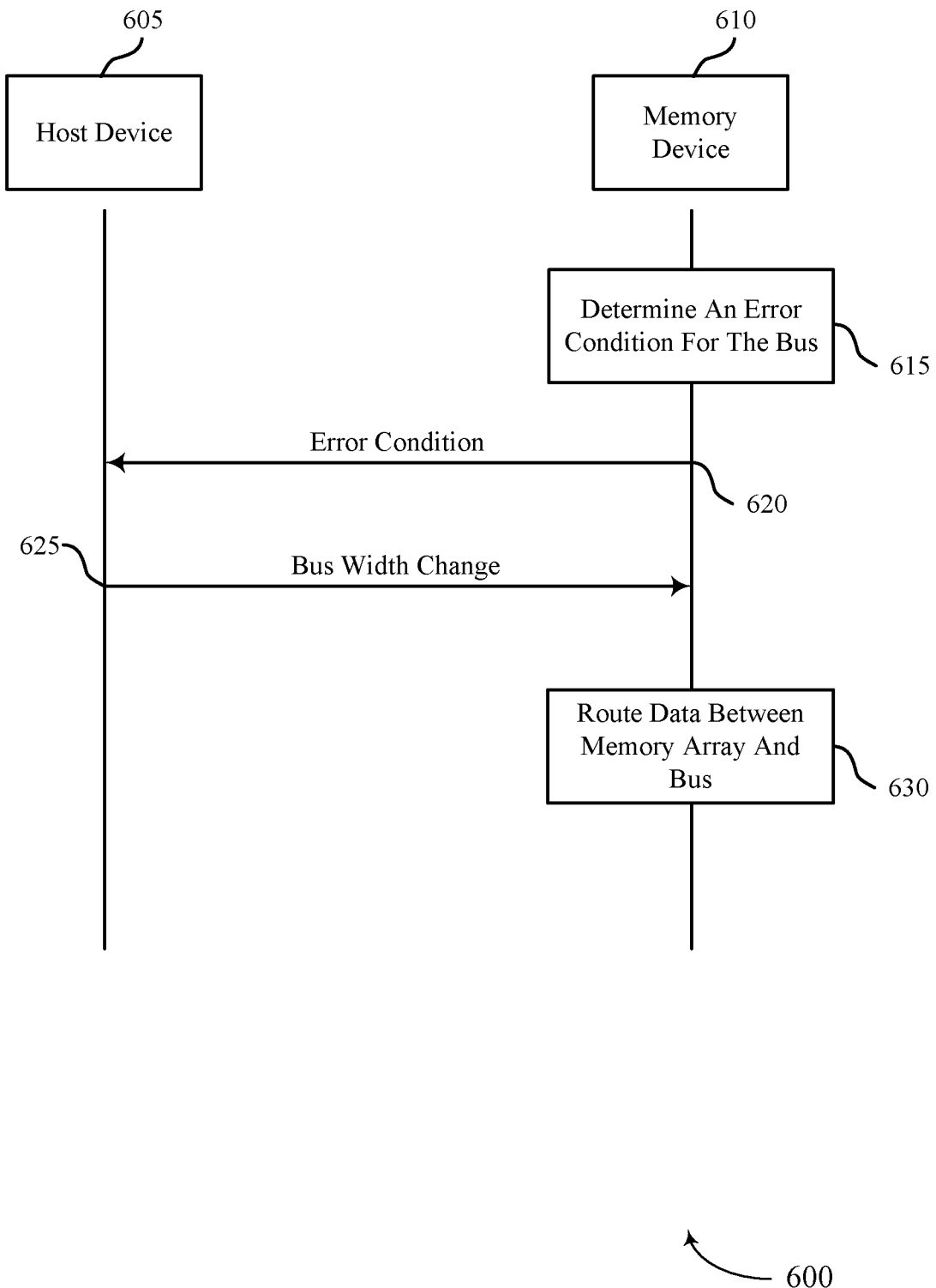

FIG. 6 illustrates an example of a process flow 600 that supports techniques for flexible bus management. In some examples, process flow 600 may be implemented by aspects of the systems 100 and 300, memory sub-array 200, timing diagrams 400, and process flow 500. The process flow 600 may include operations performed by a host device 605, which may be an example of the host device described with reference to FIGS. 1, 3, and 5. The memory device 610 may be an example of a memory device (e.g., the memory device 110, the memory dice 160, the memory sub-array 200, the memory device 310, or the memory device 510) as described with reference to FIGS. 1 through 3 and 5.

At 615, the memory device 610 may, while operating a bus with a first width, determine an error condition for a channel of the bus. In some cases, the channel of the bus may be associated with a data pin. In some examples, the channel may be included in a first subset of channels of the bus. The first subset of channels of the bus may correspond to the first width (e.g., if the first subset comprises eight (8) channels, the first width may be eight (8) bits). At 620, the memory device 610 may transmit, to the host device 605, an indication of the error condition. At 625, the memory device 610 may receive, from the host device 605, an indication of a change from the first width to a second width for the bus.

At 630, the memory device 610 may route data between a memory array of the memory device and the bus based on the change from the first width to the second width. In some cases, the memory device 610 may receive, after the change from the first width to the second width, a command from the host device 605 for access to the memory array. The memory device 610 may route the data between the memory array and a second subset of channels of the bus in response to the command. In some cases, the second subset of channels may correspond to a configuration selected from a plurality of configurations of the bus, where each configuration of the plurality of configurations may be associated with a different subset of channels of the bus.

Figure 7:
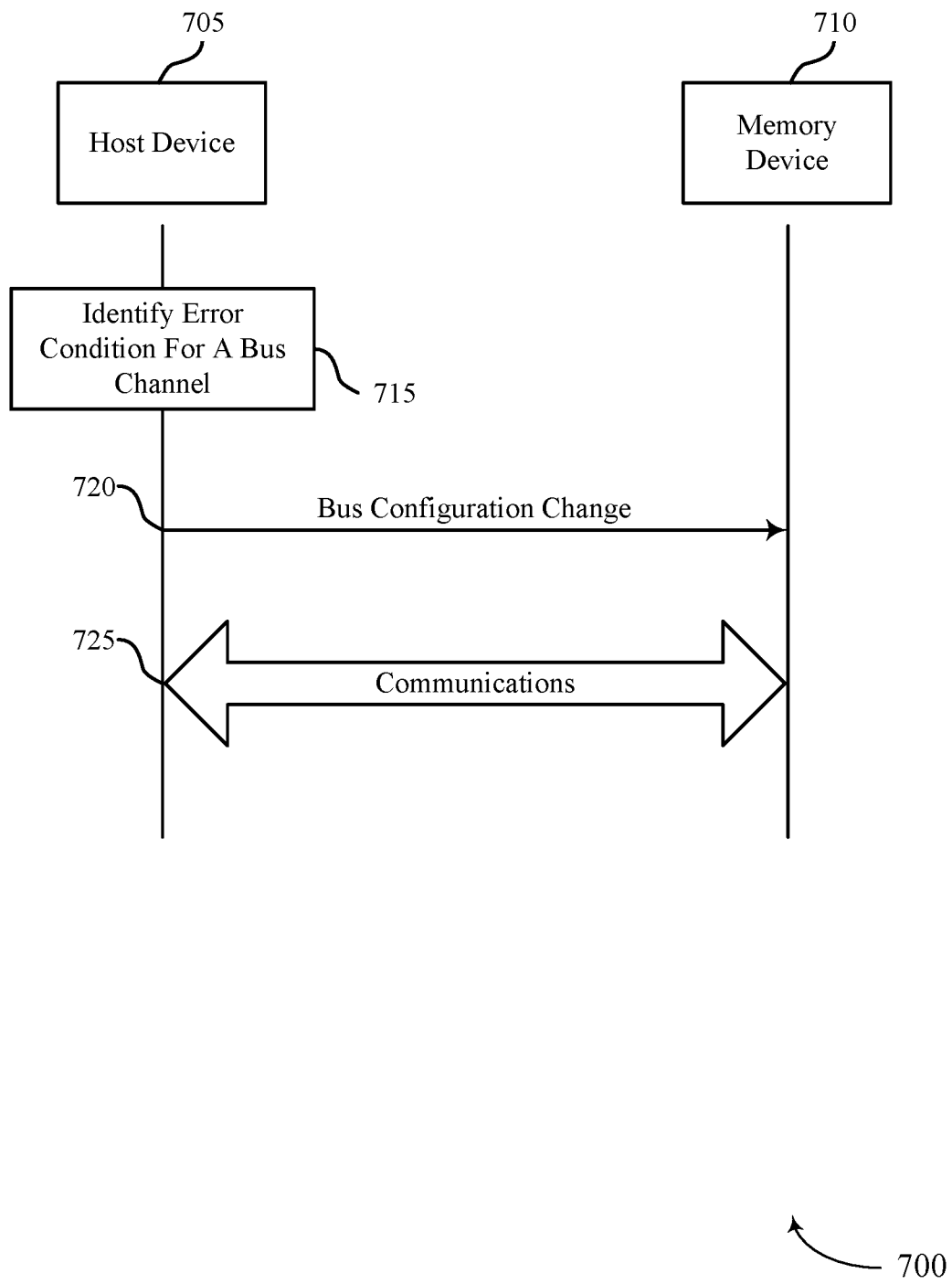

FIG. 7 illustrates an example of a process flow 700 that supports techniques for flexible bus management. In some examples, process flow 700 may be implemented by aspects of the systems 100 and 300, memory sub-array 200, timing diagrams 400, and process flows 500 and 600. The process flow 700 may include operations performed by a host device 705, which may be an example of the host device described with reference to FIGS. 1, 3, 5, and 6. The memory device 710 may be an example of a memory device (e.g., the memory device 110, the memory dice 160, the memory sub-array 200, the memory device 310, the memory device 510, or the memory device 610) as described with reference to FIGS. 1 through 3, 5, 6.

At 715, the host device 705 may identify an error condition for a channel of a bus between the host device 705 and the memory device 710. The channel of the bus may interface with the memory device 710 via a data pin. In some cases, the host device 705 may receive an indication of the error condition from the memory device, where the host device 705 identifying the error condition is based on receiving the indication of the error condition. Additionally or alternatively, the host device 705 may detect the error condition based on a measurement of the channel, or a data pattern communicated via the bus, or a combination thereof.

At 720, host device 705 may transmit, to the memory device 710, an indication of a change from a first configuration for the bus to a second configuration for the bus, the bus having a first width for the first configuration and a second width for the second configuration.

At 725, the host device may communicate, with the memory device 710 based on transmitting the indication, data over a subset of channels of the bus, the subset of channels having the second width. For example, the host device 705 may transmit, while the bus is in the second configuration, a write command and an address for the write command to the memory device 710. The host device 705 may transmit, over the subset of channels, data for the write command via multiple sequential sets of data having the second width. In another example, the host device 705 may transmit, while the bus is in the second configuration, a read command and an address for the read command to the memory device 710. The host device 705 may receive, over the subset of channels, data associated with read command via multiple sequential sets of data having the second width.

Figure 8:
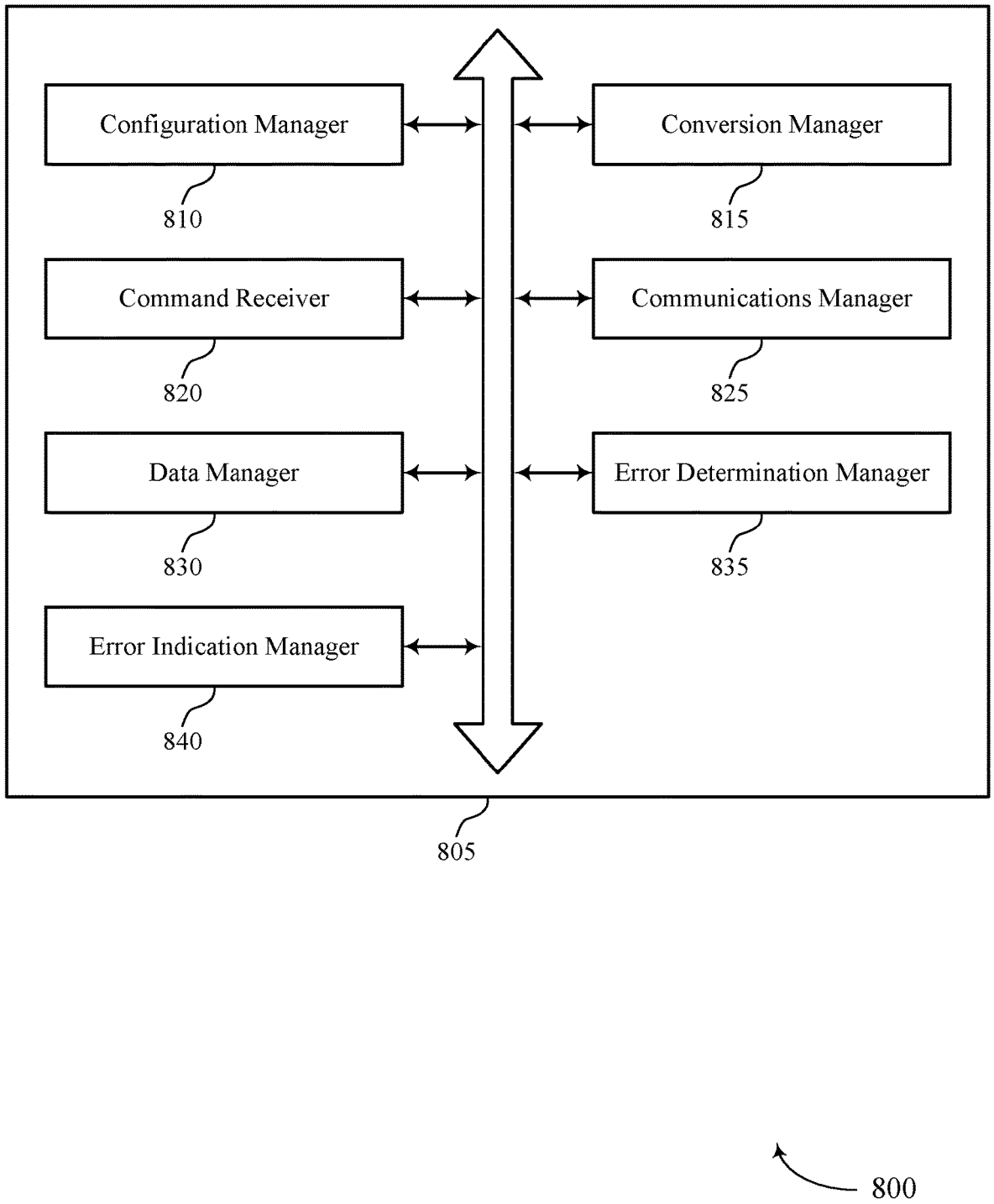

FIG. 8 shows a block diagram 800 of a device 805 that supports flexible bus management as disclosed herein. The device 805 may be an example of aspects of a memory device such as memory device 110, memory device 310, memory device 510, memory device 610, or memory device 710 as disclosed herein with reference to FIGS. 1, 3, 5, 6, and 7. The device 805 may include a configuration manager 810, a conversion manager 815, a command receiver 820, a communications manager 825, a data manager 830, an error determination manager 835, and an error indication manager 840. Each of these modules may communicate, directly or indirectly, with one another (e.g., via one or more buses).

The configuration manager 810 may receive, at a memory device in a first configuration for a bus, an indication of a change from the first configuration to a second configuration for the bus. In some cases, the second configuration is one of a set of configurations supported by the memory device, each configuration of the set of configurations associated with a different subset of channels of the bus.

The conversion manager 815 may adjust a mapping between a memory array of the memory device and the bus based on the second configuration, the bus having a first width in the first configuration and a second width in the second configuration. In some cases, the first width corresponds to a first quantity of channels of the bus being active, and the second width corresponds to a second quantity channels of the bus being active. In some examples (e.g., during a read operation), the conversion manager 815 may convert the data having the third width into multiple sets of data having the second width. In some examples, the conversion manager 815 may aggregate the multiple sets of data having the second width into data having a third width (e.g., during a write operation).

The command receiver 820 may receive, while in the second configuration, a command from a host device for access to the memory array. In some examples, the command receiver 820 may receive, while in the second configuration, a read command for a memory address from the host device. In some examples, the command receiver 820 may receive, while in the second configuration, a write command for a memory address from the host device.

The communications manager 825 may communicate, while in the second configuration and in response to the command, data between the memory array and a subset of channels of the bus, the subset of channels having the second width. In some examples, the communications manager 825 may prefetch, for the read command, data having a third width from the memory address, where the third width is common to prefetches in the first configuration and in the second configuration. In some examples, the communications manager 825 may write the data having the third width to the memory array at the memory address.

The data manager 830 may output the multiple sets of data having the second width sequentially to the host device over the subset of channels. In some examples, the data manager 830 may read commands are associated with a first burst length in the first configuration, and where the multiple sets of data having the second width correspond to a second burst length that is different from the first burst length. In some examples, the data manager 830 may receive, for the write command, multiple sets of data having the second width sequentially over the subset of channels. In some examples, the data manager 830 may write commands are associated with a first burst length in the first configuration, and where the multiple sets of data having the second width correspond to a second burst length that is different from the first burst length.

The configuration manager 810 may receive, from the host device, an indication of a change from the first width to a second width for the bus.

The conversion manager 815 may route data between a memory array of the memory device and the bus based on the change from the first width to the second width. In some examples, the conversion manager 815 may route the data between the memory array and a second subset of channels of the bus in response to the command (e.g., a command received from a host device). In some cases, the second subset of channels corresponds to a configuration selected from a set of configurations of the bus, each configuration of the set of configurations associated with a different subset of channels of the bus.

The command receiver 820 may receive, after the change from the first width to the second width, a command from the host device for access to the memory array.

The error determination manager 835 may determine, at a memory device operating a bus with a first width, an error condition for a channel of the bus. The error indication manager 840 may transmit, to a host device, an indication of the error condition.

Figure 9:
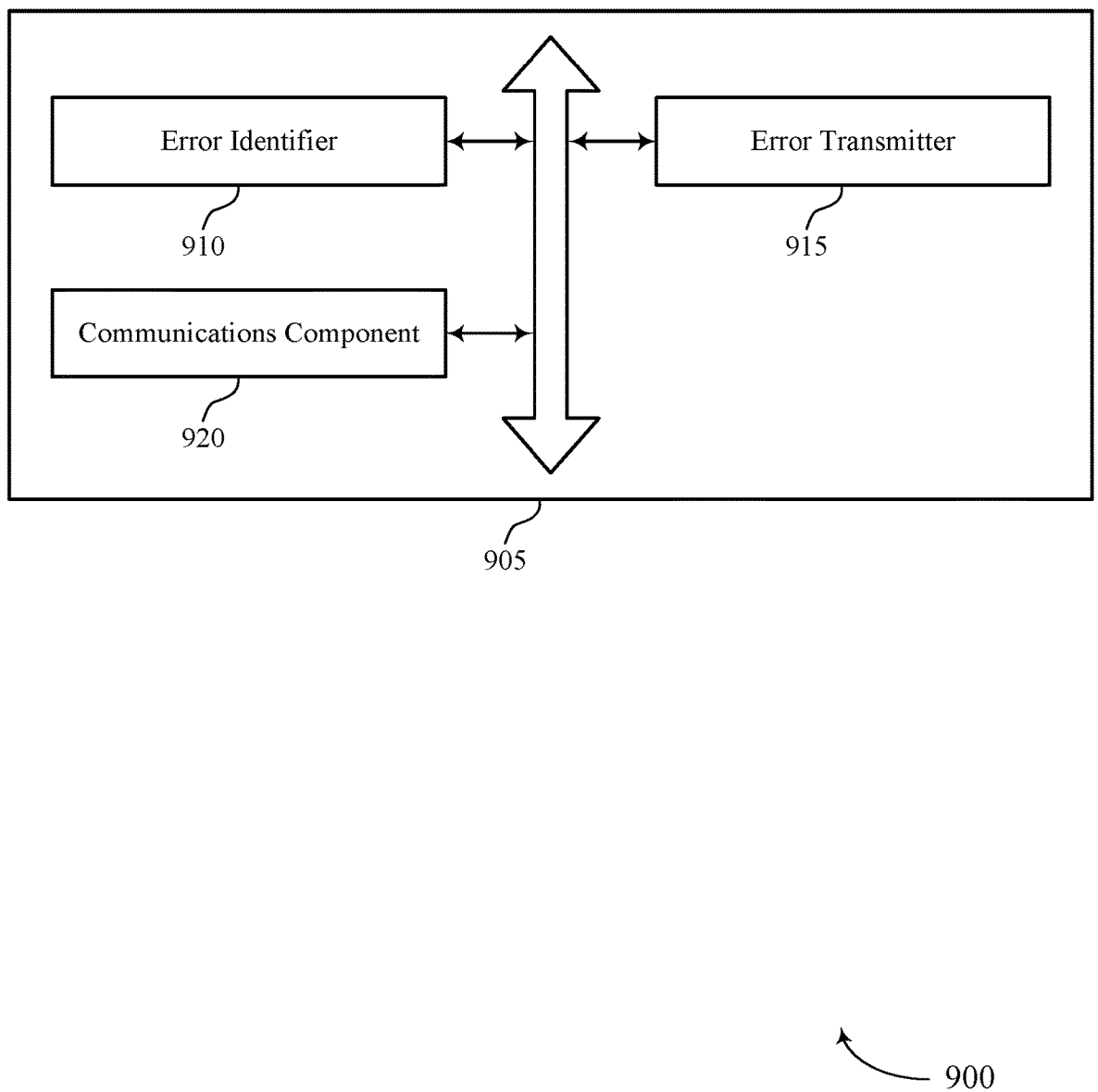

FIG. 9 shows a block diagram 900 of a device 905 that supports flexible bus management as disclosed herein. The device 905 may be an example of aspects of a host device such as host device 305, host device 505, host device 605, or host device 705 as disclosed herein with reference to FIGS. 3 and 5 through 7. The device 905 may include an error identifier 910, an error transmitter 915, and a communications component 920. Each of these modules may communicate, directly or indirectly, with one another (e.g., via one or more buses).

The error identifier 910 may identify, at a host device, an error condition for a channel of a bus between the host device and a memory device. In some examples, the error identifier 910 may receive an indication of the error condition from the memory device, where identifying the error condition is based on receiving the indication of the error condition. In some examples, the error identifier 910 may detect, by the host device, the error condition based on a measurement of the channel, or a data pattern communicated via the bus, or a combination thereof.

The error transmitter 915 may transmit, to the memory device, an indication of a change from a first configuration for the bus to a second configuration for the bus, the bus having a first width for the first configuration and a second width for the second configuration.

The communications component 920 may communicate, with the memory device based on transmitting the indication, data over a subset of channels of the bus, the subset of channels having the second width. In some examples, the communications component 920 may transmit, while the bus is in the second configuration, a write command and an address for the write command to the memory device. In some examples, the communications component 920 may transmit, over the subset of channels, data for the write command via multiple sequential sets of data having the second width. In some examples, the communications component 920 may transmit, while the bus is in the second configuration, a read command and an address for the read command to the memory device. In some examples, the communications component 920 may receive, over the subset of channels, data associated with the read command via multiple sequential sets of data having the second width.

Figure 10:
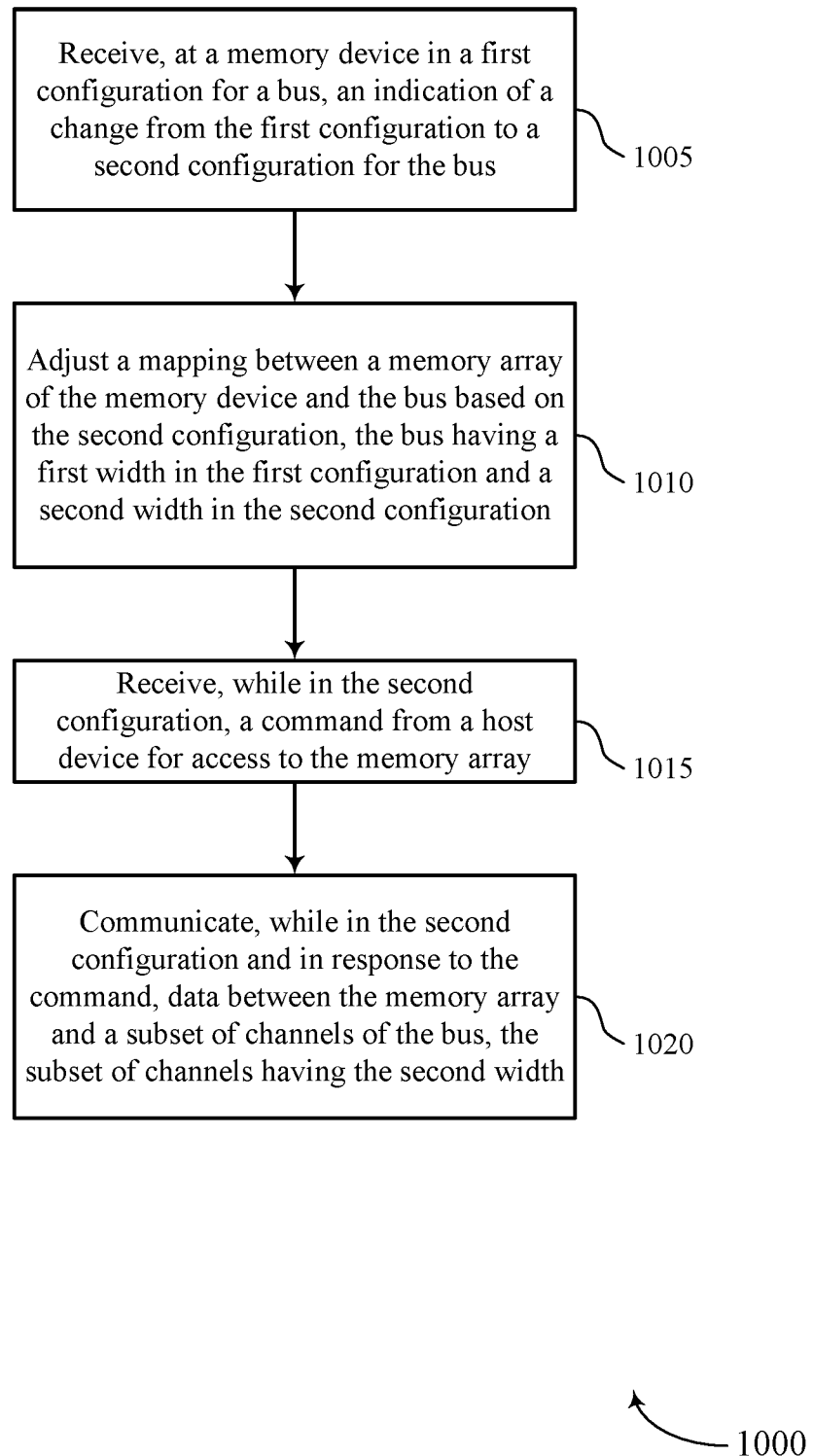

FIG. 10 shows a flowchart illustrating a method 1000 that supports systems, devices, and methods for flexible bus management as disclosed herein. The operations of method 1000 may be implemented by a memory device (e.g., memory device 110, memory device 310, memory device 510, memory device 610, or memory device 710 as disclosed herein with reference to FIGS. 1, 3, 5, 6, and 7) or its components as described herein. In some examples, a memory device may execute a set of instructions to control the functional elements of the memory device to perform the functions described herein. Additionally or alternatively, a memory device may perform aspects of the functions described herein using special-purpose hardware.

At 1005, the memory device may receive, at a memory device in a first configuration for a bus, an indication of a change from the first configuration to a second configuration for the bus. The operations of 1005 may be performed according to the methods described herein. In some examples, aspects of the operations of 1005 may be performed by a configuration manager as described with reference to FIG. 8.

At 1010, the memory device may adjust a mapping between a memory array of the memory device and the bus based on the second configuration, the bus having a first width in the first configuration and a second width in the second configuration. The operations of 1010 may be performed according to the methods described herein. In some examples, aspects of the operations of 1010 may be performed by a conversion manager as described with reference to FIG. 8.

At 1015, the memory device may receive, while in the second configuration, a command from a host device for access to the memory array. The operations of 1015 may be performed according to the methods described herein. In some examples, aspects of the operations of 1015 may be performed by a command receiver as described with reference to FIG. 8.

At 1020, the memory device may communicate, while in the second configuration and in response to the command, data between the memory array and a subset of channels of the bus, the subset of channels having the second width. The operations of 1020 may be performed according to the methods described herein. In some examples, aspects of the operations of 1020 may be performed by a communications manager as described with reference to FIG. 8.

An apparatus for performing a method or methods, such as the method 1000, is described. The apparatus may include features for receiving, at a memory device in a first configuration for a bus, an indication of a change from the first configuration to a second configuration for the bus, adjusting a mapping between a memory array of the memory device and the bus based on the second configuration, the bus having a first width in the first configuration and a second width in the second configuration, receiving, while in the second configuration, a command from a host device for access to the memory array, and communicating, while in the second configuration and in response to the command, data between the memory array and a subset of channels of the bus, the subset of channels having the second width.

In some examples, the apparatus may include features for receiving, while in the second configuration, a read command for a memory address from the host device, prefetching, for the read command, data having a third width from the memory address, where the third width may be common to prefetches in the first configuration and in the second configuration, converting the data having the third width into multiple sets of data having the second width, and outputting the multiple sets of data having the second width sequentially to the host device over the subset of channels.

In some cases, the apparatus may include features for reading commands may be associated with a first burst length in the first configuration, and where the multiple sets of data having the second width correspond to a second burst length that may be different from the first burst length.

In some instances, the apparatus may include features for receiving, while in the second configuration, a write command for a memory address from the host device, receiving, for the write command, multiple sets of data having the second width sequentially over the subset of channels, aggregating the multiple sets of data having the second width into data having a third width, and writing the data having the third width to the memory array at the memory address.

In some examples, the apparatus may include features for write commands that may be associated with a first burst length in the first configuration, and where the multiple sets of data having the second width correspond to a second burst length that may be different from the first burst length.

In some cases, the second configuration may be one of a set of configurations supported by the memory device, each configuration of the set of configurations associated with a different subset of channels of the bus.

In some instances, the first width corresponds to a first quantity of channels of the bus being active, and the second width corresponds to a second quantity channels of the bus being active.

Figure 11:
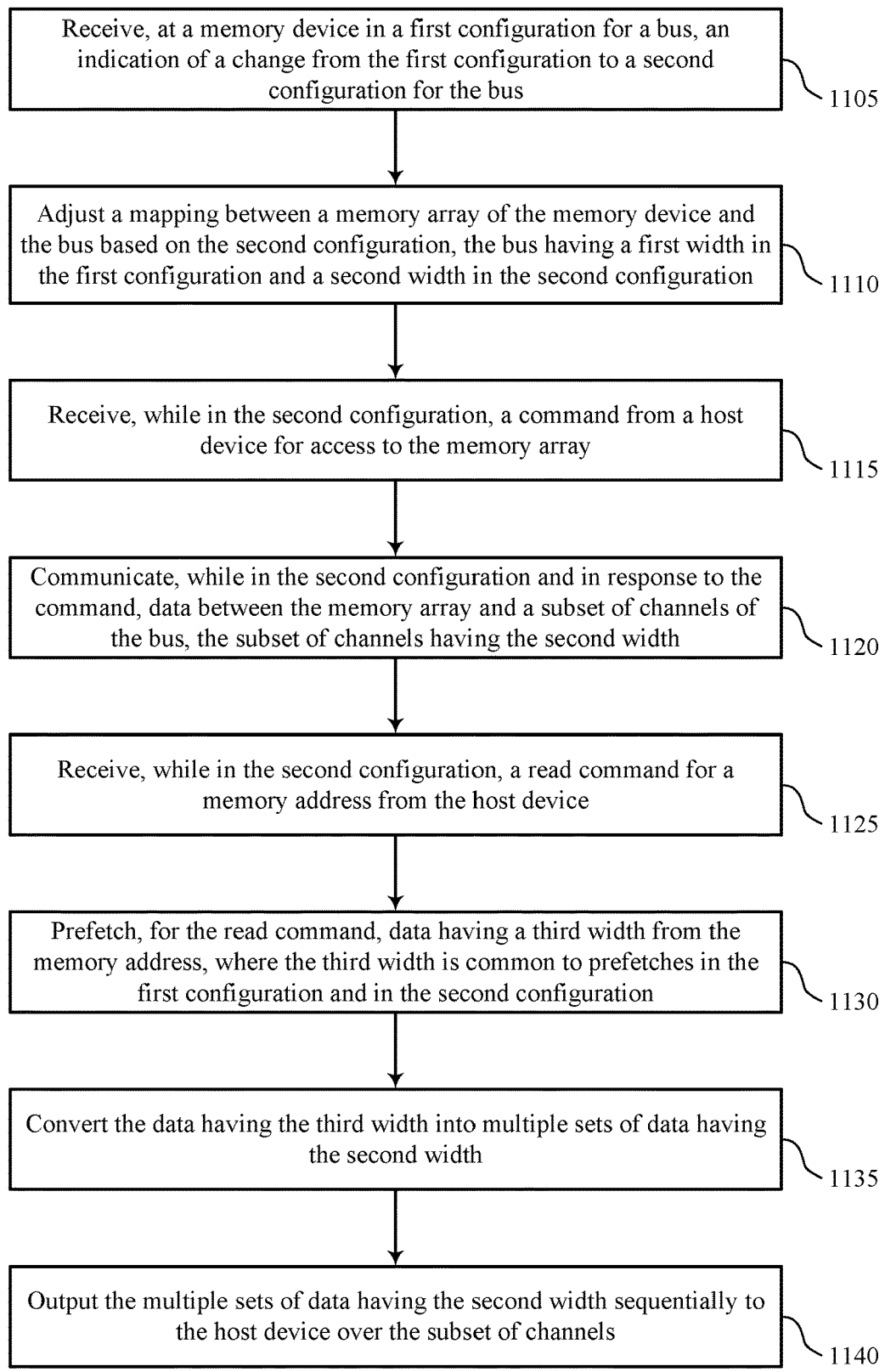

FIG. 11 shows a flowchart illustrating a method 1100 that supports flexible bus management as disclosed herein. The operations of method 1100 may be implemented by a memory device (e.g., memory device 110, memory device 310, memory device 510, memory device 610, or memory device 710 as disclosed herein with reference to FIGS. 1, 3, 5, 6, and 7) or its components as described herein. In some examples, a memory device may execute a set of instructions to control the functional elements of the memory device to perform the functions described herein. Additionally or alternatively, a memory device may perform aspects of the functions described herein using special-purpose hardware.

At 1105, the memory device may receive, at a memory device in a first configuration for a bus, an indication of a change from the first configuration to a second configuration for the bus. The operations of 1105 may be performed according to the methods described herein. In some examples, aspects of the operations of 1105 may be performed by a configuration manager as described with reference to FIG. 8.

At 1110, the memory device may adjust a mapping between a memory array of the memory device and the bus based on the second configuration, the bus having a first width in the first configuration and a second width in the second configuration. The operations of 1110 may be performed according to the methods described herein. In some examples, aspects of the operations of 1110 may be performed by a conversion manager as described with reference to FIG. 8.

At 1115, the memory device may receive, while in the second configuration, a command from a host device for access to the memory array. The operations of 1115 may be performed according to the methods described herein. In some examples, aspects of the operations of 1115 may be performed by a command receiver as described with reference to FIG. 8.

At 1120, the memory device may communicate, while in the second configuration and in response to the command, data between the memory array and a subset of channels of the bus, the subset of channels having the second width. The operations of 1120 may be performed according to the methods described herein. In some examples, aspects of the operations of 1120 may be performed by a communications manager as described with reference to FIG. 8.

At 1125, the memory device may receive, while in the second configuration, a read command for a memory address from the host device. The operations of 1125 may be performed according to the methods described herein. In some examples, aspects of the operations of 1125 may be performed by a command receiver as described with reference to FIG. 8.

At 1130, the memory device may prefetch, for the read command, data having a third width from the memory address, where the third width is common to prefetches in the first configuration and in the second configuration. The operations of 1130 may be performed according to the methods described herein. In some examples, aspects of the operations of 1130 may be performed by a communications manager as described with reference to FIG. 8.

At 1135, the memory device may convert the data having the third width into multiple sets of data having the second width. The operations of 1135 may be performed according to the methods described herein. In some examples, aspects of the operations of 1135 may be performed by a conversion manager as described with reference to FIG. 8.

At 1140, the memory device may output the multiple sets of data having the second width sequentially to the host device over the subset of channels. The operations of 1140 may be performed according to the methods described herein. In some examples, aspects of the operations of 1140 may be performed by a data manager as described with reference to FIG. 8.

Figure 12:
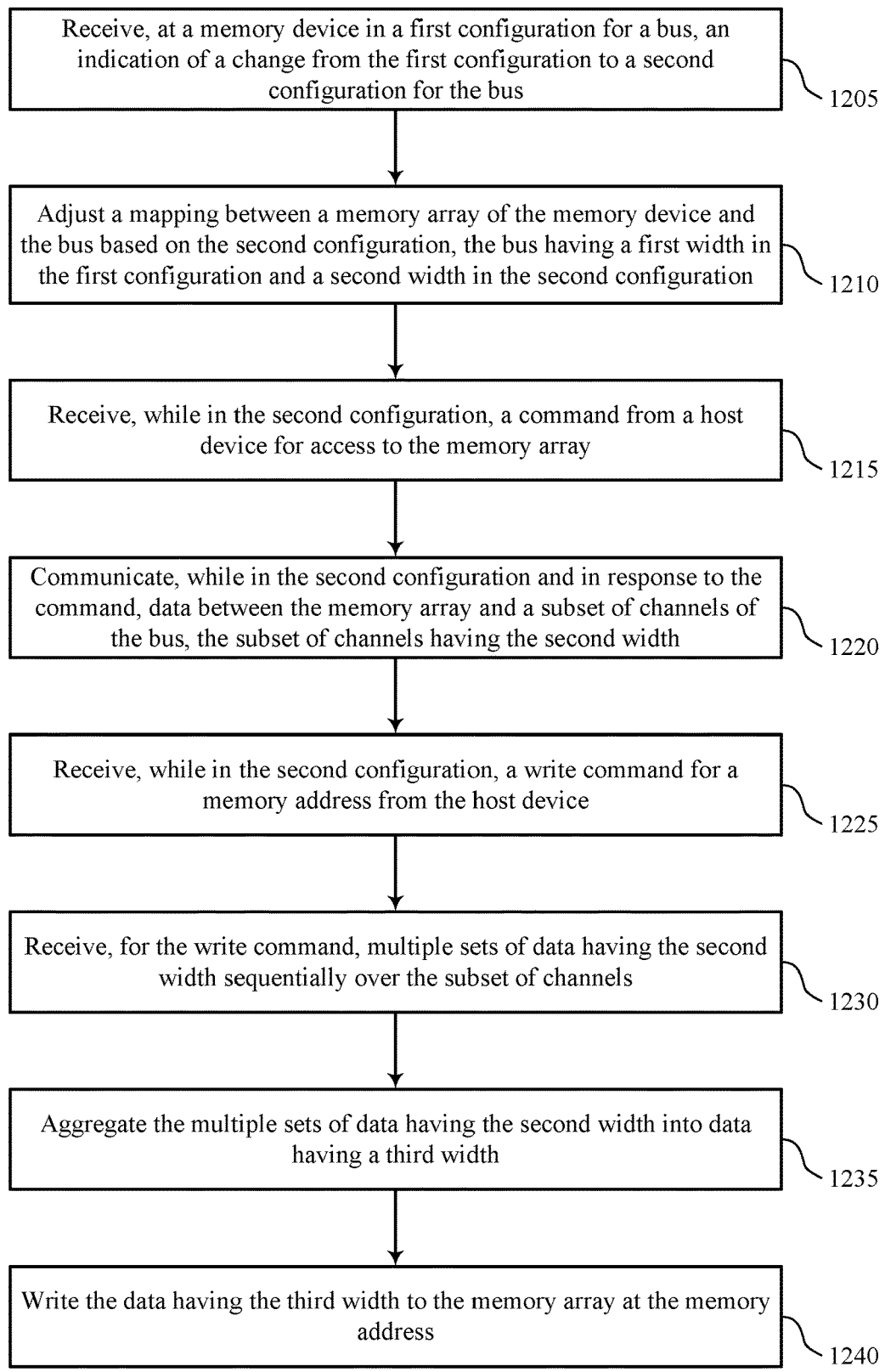

FIG. 12 shows a flowchart illustrating a method 1200 that supports flexible bus management as disclosed herein. The operations of method 1200 may be implemented by a memory device (e.g., memory device 110, memory device 310, memory device 510, memory device 610, or memory device 710 as disclosed herein with reference to FIGS. 1, 3, 5, 6, and 7) or its components as described herein. In some examples, a memory device may execute a set of instructions to control the functional elements of the memory device to perform the functions described herein. Additionally or alternatively, a memory device may perform aspects of the functions described herein using special-purpose hardware.

At 1205, the memory device may receive, at a memory device in a first configuration for a bus, an indication of a change from the first configuration to a second configuration for the bus. The operations of 1205 may be performed according to the methods described herein. In some examples, aspects of the operations of 1205 may be performed by a configuration manager as described with reference to FIG. 8.

At 1210, the memory device may adjust a mapping between a memory array of the memory device and the bus based on the second configuration, the bus having a first width in the first configuration and a second width in the second configuration. The operations of 1210 may be performed according to the methods described herein. In some examples, aspects of the operations of 1210 may be performed by a conversion manager as described with reference to FIG. 8.

At 1215, the memory device may receive, while in the second configuration, a command from a host device for access to the memory array. The operations of 1215 may be performed according to the methods described herein. In some examples, aspects of the operations of 1215 may be performed by a command receiver as described with reference to FIG. 8.

At 1220, the memory device may communicate, while in the second configuration and in response to the command, data between the memory array and a subset of channels of the bus, the subset of channels having the second width. The operations of 1220 may be performed according to the methods described herein. In some examples, aspects of the operations of 1220 may be performed by a communications manager as described with reference to FIG. 8.

At 1225, the memory device may receive, while in the second configuration, a write command for a memory address from the host device. The operations of 1225 may be performed according to the methods described herein. In some examples, aspects of the operations of 1225 may be performed by a command receiver as described with reference to FIG. 8.

At 1230, the memory device may receive, for the write command, multiple sets of data having the second width sequentially over the subset of channels. The operations of 1230 may be performed according to the methods described herein. In some examples, aspects of the operations of 1230 may be performed by a data manager as described with reference to FIG. 8.

At 1235, the memory device may aggregate the multiple sets of data having the second width into data having a third width. The operations of 1235 may be performed according to the methods described herein. In some examples, aspects of the operations of 1235 may be performed by a conversion manager as described with reference to FIG. 8.

At 1240, the memory device may write the data having the third width to the memory array at the memory address. The operations of 1240 may be performed according to the methods described herein. In some examples, aspects of the operations of 1240 may be performed by a communications manager as described with reference to FIG. 8.

Figure 13:
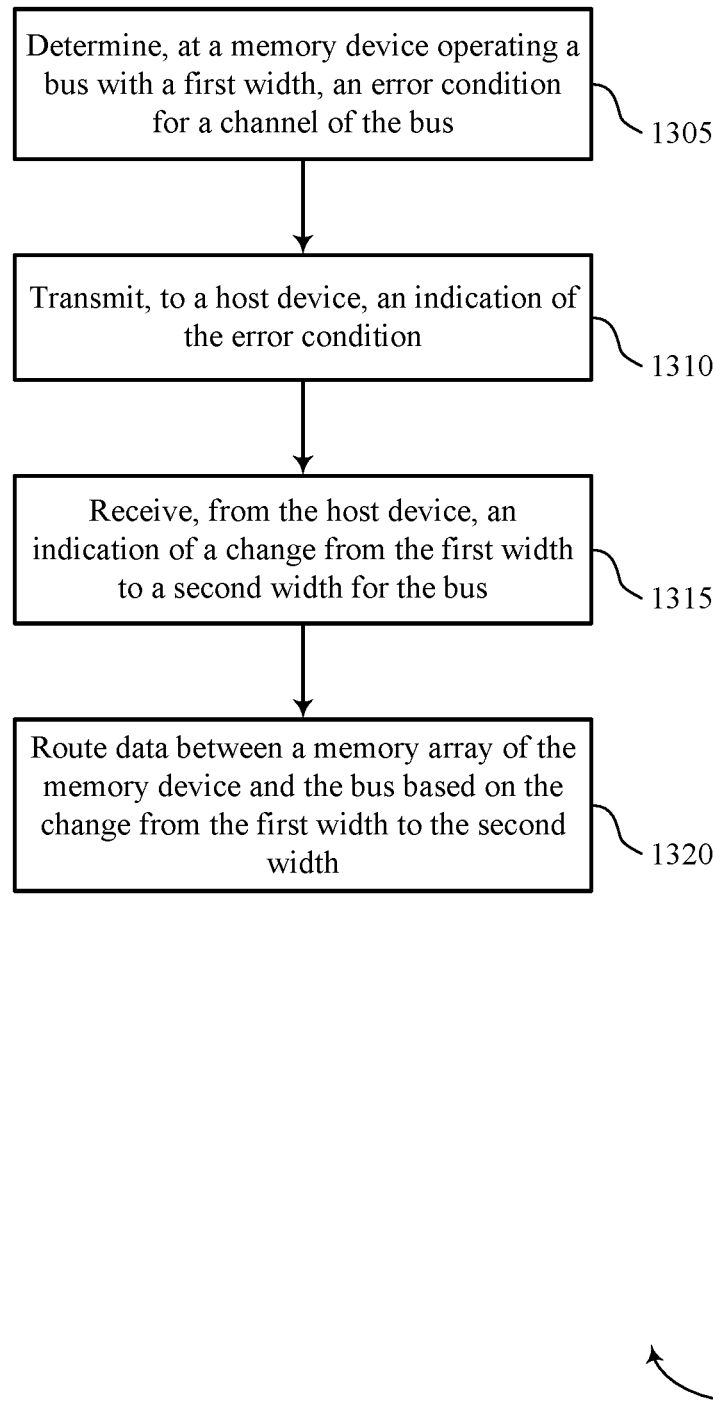

FIG. 13 shows a flowchart illustrating a method 1300 that supports flexible bus management as disclosed herein. The operations of method 1300 may be implemented by a memory device (e.g., memory device 110, memory device 310, memory device 510, memory device 610, or memory device 710 as disclosed herein with reference to FIGS. 1, 3, 5, 6, and 7) or its components as described herein. In some examples, a memory device may execute a set of instructions to control the functional elements of the memory device to perform the functions described herein. Additionally or alternatively, a memory device may perform aspects of the functions described herein using special-purpose hardware.

At 1305, the memory device may determine, at a memory device operating a bus with a first width, an error condition for a channel of the bus. The operations of 1305 may be performed according to the methods described herein. In some examples, aspects of the operations of 1305 may be performed by an error determination manager as described with reference to FIG. 8.

At 1310, the memory device may transmit, to a host device, an indication of the error condition. The operations of 1310 may be performed according to the methods described herein. In some examples, aspects of the operations of 1310 may be performed by an error indication manager as described with reference to FIG. 8.

At 1315, the memory device may receive, from the host device, an indication of a change from the first width to a second width for the bus. The operations of 1315 may be performed according to the methods described herein. In some examples, aspects of the operations of 1315 may be performed by a configuration manager as described with reference to FIG. 8.

At 1320, the memory device may route data between a memory array of the memory device and the bus based on the change from the first width to the second width. The operations of 1320 may be performed according to the methods described herein. In some examples, aspects of the operations of 1320 may be performed by a conversion manager as described with reference to FIG. 8.

An apparatus for performing a method or methods, such as the method 1300, is described. The apparatus may include features for determining, at a memory device operating a bus with a first width, an error condition for a channel of the bus, transmitting, to a host device, an indication of the error condition, receiving, from the host device, an indication of a change from the first width to a second width for the bus, and routing data between a memory array of the memory device and the bus based on the change from the first width to the second width.

In some examples, the apparatus may include features for receiving, after the change from the first width to the second width, a command from the host device for access to the memory array, and routing the data between the memory array and a second subset of channels of the bus in response to the command.

In some cases, the second subset of channels corresponds to a configuration selected from a set of configurations of the bus, each configuration of the set of configurations associated with a different subset of channels of the bus.

Figure 14:
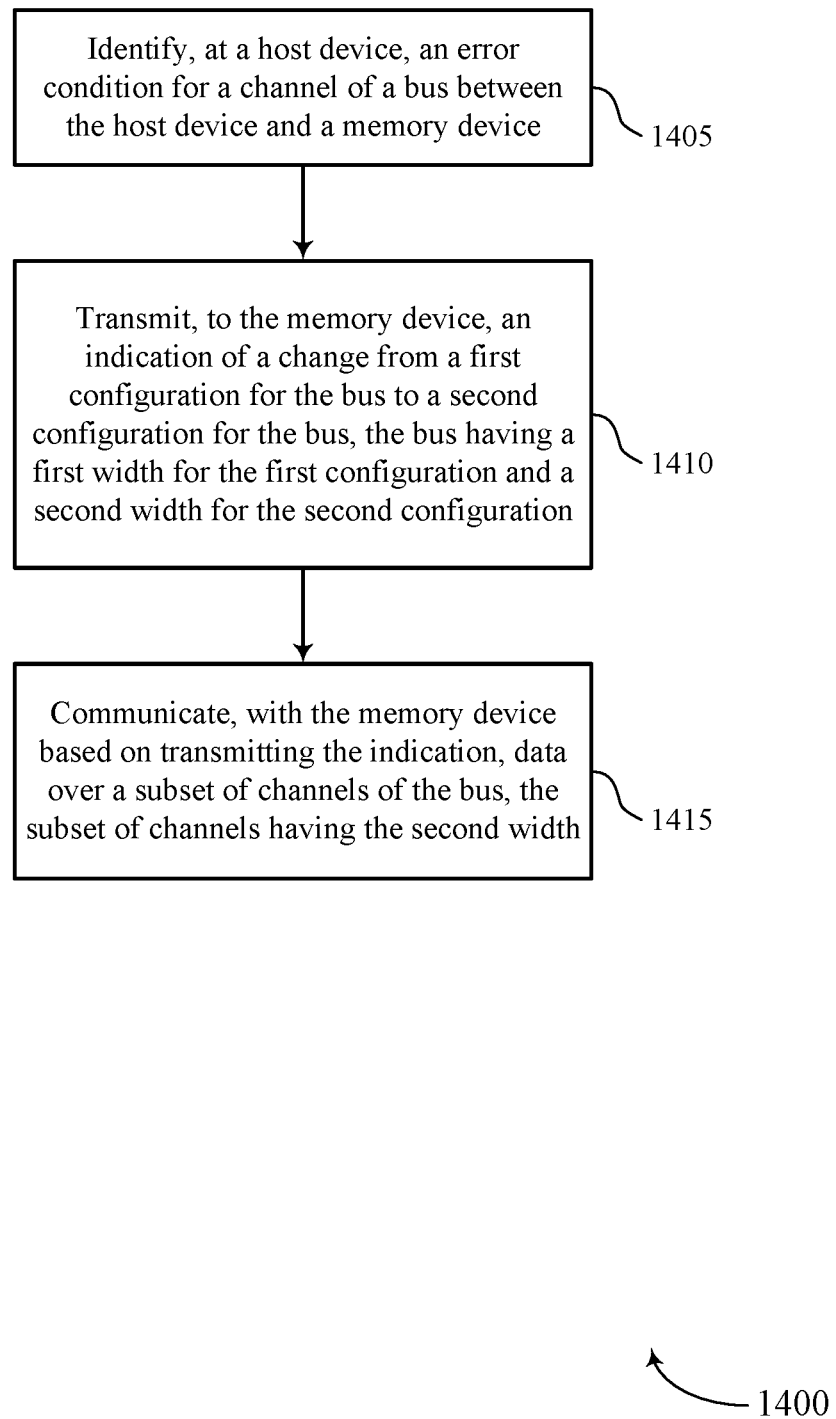

FIG. 14 shows a flowchart illustrating a method 1400 that supports flexible bus management as disclosed herein. The operations of method 1400 may be implemented by a host device (e.g., host device 305, host device 505, host device 605, or host device 705 as disclosed herein with reference to FIGS. 3 and 5 through 7) or its components as described herein. In some examples, a host device may execute a set of instructions to control the functional elements of the host device to perform the functions described herein. Additionally or alternatively, a host device may perform aspects of the functions described herein using special-purpose hardware.

At 1405, the host device may identify an error condition for a channel of a bus between the host device and a memory device. The operations of 1405 may be performed according to the methods described herein. In some examples, aspects of the operations of 1405 may be performed by an error identifier as described with reference to FIG. 9.

At 1410, the host device may transmit, to the memory device, an indication of a change from a first configuration for the bus to a second configuration for the bus, the bus having a first width for the first configuration and a second width for the second configuration. The operations of 1410 may be performed according to the methods described herein. In some examples, aspects of the operations of 1410 may be performed by an error transmitter as described with reference to FIG. 9.

At 1415, the host device may communicate, with the memory device based on transmitting the indication, data over a subset of channels of the bus, the subset of channels having the second width. The operations of 1415 may be performed according to the methods described herein. In some examples, aspects of the operations of 1415 may be performed by a communications component as described with reference to FIG. 9.

An apparatus for performing a method or methods, such as the method 1400, is described. The apparatus may include features for identifying, at a host device, an error condition for a channel of a bus between the host device and a memory device, transmitting, to the memory device, an indication of a change from a first configuration for the bus to a second configuration for the bus, the bus having a first width for the first configuration and a second width for the second configuration, and communicating, with the memory device based on transmitting the indication, data over a subset of channels of the bus, the subset of channels having the second width.

In some examples, the apparatus may include features for receiving an indication of the error condition from the memory device, where identifying the error condition may be based on receiving the indication of the error condition.

In some cases, the apparatus may include features for detecting, by the host device, the error condition based on a measurement of the channel, or a data pattern communicated via the bus, or a combination thereof.

In some instances, the apparatus may include features for transmitting, while the bus may be in the second configuration, a write command and an address for the write command to the memory device, and transmitting, over the subset of channels, data for the write command via multiple sequential sets of data having the second width.

In some examples, the apparatus may include features for transmitting, while the bus may be in the second configuration, a read command and an address for the read command to the memory device, and receiving, over the subset of channels, data associated with the read command via multiple sequential sets of data having the second width.

It should be noted that the methods described herein describe possible implementations, and that the operations and the steps may be rearranged or otherwise modified and that other implementations are possible. Further, aspects from two or more of the methods may be combined.

In some examples, an apparatus for flexible bus management may perform aspects of the functions described herein using general- or special-purpose hardware. The apparatus may include a set of pins operable to communicate data over a bus between the device and a host device, a buffer coupled with the set of pins and a memory array, the buffer operable to communicate first sets of data having a first width via the set of pins in a first configuration and operable to communicate second sets of data having a second width via a subset of the set of pins in a second configuration, and circuitry coupled with the buffer and the set of pins, the circuitry operable to receive an indication a change of the buffer from the first configuration to the second configuration and switch the buffer from the first configuration to the second configuration based at least in part on the indication of the change.

In some cases, the buffer may be operable to, when in a third configuration, communicate the second sets of data having the second width via a second subset of the set of pins.

In some instances, the buffer may be operable to, in a fourth configuration, communicate third sets of data having a third width via a third subset of the set of pins.

In some examples, the apparatus may include a decoder operable to receive, in the second configuration, a read command for a memory address, where the buffer may be operable to, in the second configuration and in response to the read command, convert the data having the first width into multiple sets of data having the second width, and transmit the multiple sets of data having the second width sequentially to the host device over the subset of the set of pins.

In some cases, the apparatus may include a decoder operable to receive, in the second configuration, a write command for a memory address, where the buffer may be operable to, in the second configuration for the write command, combine the multiple sets of data having the second width into data having a third width, and write the data having the third width to the memory array at the memory address.

In some instances, the circuitry may be further operable to detect an error condition for communication via at least one of the set of pins, and transmit, to the host device, an indication of the error condition for the at least one of the set of pins.

In some examples, the error condition includes an open or a shorted condition for the at least one of the set of pins.

In some cases, the apparatus may include a switch coupled with the set of pins and the buffer, the switch operable to, in the first configuration, connect the set of pins to the buffer, and to, in the second configuration, connect the subset of the set of pins to the buffer.

In some instances, the switch may be operable to, in a third configuration, connect a second subset of the set of pins to the buffer.

In some examples, at least one of the subset or the second subset of the set of pins includes a first pin having a first index and a second pin having a second index, and excludes a third pin having a third index that may be greater than the first index and less than the second index.

Although certain features may be described herein with respect to or in the context of DRAM technology, this is for illustrative purposes only, and one of ordinary skill in the art will appreciate that the teachings herein may be applied to any type of memory device. For example, the teachings herein may be applied to volatile or non-volatile memory devices such as magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
receiving, at a memory device in a first configuration for a bus, an indication of a change from the first configuration to a second configuration for the bus;
adjusting a mapping between a memory array of the memory device and the bus based at least in part on the second configuration, the bus having a first plurality of channels configured for data transfer in the first configuration and a second plurality of channels configured for data transfer in the second configuration, wherein the indication comprises an index selected from a plurality of indices, the index indicating the second plurality of channels, and wherein the second plurality of channels is a subset of the first plurality of channels;
receiving, while in the second configuration, a command from a host device for access to the memory array; and
communicating, while in the second configuration and in response to the command, data between the memory array and a second device over the second plurality of channels of the bus, wherein communicating the data over the second plurality of channels is exclusive of any other channels of the bus, and wherein the communicating comprises:
deactivating one or more channels of the first plurality of channels based at least in part on the indication, wherein the one or more channels are not included in the second plurality of channels.

2. The method of claim 1, further comprising:
receiving, while in the second configuration, a read command for a memory address from the host device;
prefetching, for the read command, data having a third width from the memory address, wherein the third width is common to prefetches in the first configuration and in the second configuration;
converting the data having the third width into multiple sets of data having a second width corresponding to the second plurality of channels; and
outputting the multiple sets of data having the second width sequentially to the host device over the second plurality of channels.

3. The method of claim 2, wherein:
read commands are associated with a first burst length in the first configuration, and wherein the multiple sets of data having the second width correspond to a second burst length that is different from the first burst length.

4. The method of claim 1, further comprising:
receiving, while in the second configuration, a write command for a memory address from the host device;
receiving, for the write command, multiple sets of data having a second width corresponding to the second plurality of channels sequentially over the second plurality of channels;
aggregating the multiple sets of data having the second width into data having a third width; and
writing the data having the third width to the memory array at the memory address.

5. The method of claim 4, wherein:
write commands are associated with a first burst length in the first configuration, and wherein the multiple sets of data having the second width correspond to a second burst length that is different from the first burst length.

6. The method of claim 1, wherein the second configuration is one of a plurality of configurations supported by the memory device, each configuration of the plurality of configurations associated with a different subset of channels of the bus.

7. The method of claim 1, wherein the first plurality of channels corresponds to a first quantity of channels of the bus being active, and the second plurality of channels corresponds to a second quantity channels of the bus being active.

8. A method, comprising:
determining, at a memory device operating a bus with a first width, an error condition for a channel of the bus, the error condition based at least in part on a physical measurement of the channel indicating a fault associated with the channel;
transmitting, to a host device, an indication of the error condition;
receiving, from the host device, an indication of a change from the first width to a second width for the bus, wherein the first width corresponds to a first plurality of channels of the bus and the second width corresponds to a second plurality of channels of the bus, and wherein the second plurality of channels is a subset of the first plurality of channels; and
routing data between a memory array of the memory device and the bus over the second plurality of channels based at least in part on the change from the first width to the second width, wherein the routing of the data between the memory array and the bus over the second plurality of channels is exclusive of any other channels of the bus, and wherein the routing comprises:
deactivating one or more channels of the first plurality of channels configured for data transfer based at least in part on the indication of the change from the first width to the second width for the bus.

9. The method of claim 8, wherein the channel is included in the first plurality of channels of the bus, the method further comprising:
receiving, after the change from the first width to the second width, a command from the host device for access to the memory array; and
routing the data between the memory array and the second plurality of channels of the bus in response to the command.

10. The method of claim 9, wherein the second plurality of channels corresponds to a configuration selected from a plurality of configurations of the bus, each configuration of the plurality of configurations associated with a different plurality of channels of the bus.

11. A method, comprising:
identifying, at a host device, an error condition for a channel of a bus between the host device and a memory device;
transmitting, to the memory device, an indication of a change from a first configuration for the bus to a second configuration for the bus, the bus having a first plurality of channels configured for data transfer for the first configuration and a second plurality of channels configured for data transfer for the second configuration, wherein the indication comprises an index selected from a plurality of indices, the index indicating of the second plurality of channels, and wherein the second plurality of channels is a subset of the first plurality of channels; and
communicating, with the memory device based at least in part on transmitting the indication, data over the second plurality of channels of the bus, wherein the communicating the data over the second plurality of channels is exclusive of any other channels of the bus, and wherein the communicating comprises:
deactivating one or more channels of the first plurality of channels based at least in part on the indication, wherein the one or more channels are not included in the second plurality of channels.

12. The method of claim 11, further comprising:
receiving an indication of the error condition from the memory device, wherein identifying the error condition is based at least in part on receiving the indication of the error condition.

13. The method of claim 11, further comprising:
detecting, by the host device, the error condition based at least in part on a measurement of the channel, or a data pattern communicated via the bus, or a combination thereof.

14. The method of claim 11, further comprising:
transmitting, while the bus is in the second configuration, a write command and an address for the write command to the memory device; and
transmitting, over the second plurality of channels, data for the write command via multiple sequential sets of data having a width corresponding to the second plurality of channels.

15. The method of claim 11, further comprising:
transmitting, while the bus is in the second configuration, a read command and an address for the read command to the memory device; and
receiving, over the second plurality of channels, data associated with the read command via multiple sequential sets of data having a width corresponding to the second plurality of channels.

16. A device, comprising:
a plurality of pins operable to communicate data over a bus between the device and a host device;
a buffer coupled with the plurality of pins and a memory array, the buffer operable to communicate first sets of data having a first width via a first plurality of channels in a first configuration and operable to communicate second sets of data having a second width via a second plurality of channels in a second configuration, wherein the second plurality of channels is a subset of the first plurality of channels; and
circuitry coupled with the buffer and the plurality of pins, the circuitry operable to:
receive an indication of a change of the buffer from the first configuration to the second configuration, wherein the indication comprises an index selected from a plurality of indices, the index indicating the second plurality of channels;
switch the buffer from the first configuration to the second configuration based at least in part on the indication of the change; and
communicate, while in the second configuration and in response to the indication, the second sets of data via the second plurality of channels based at least in part on deactivating one or more channels of the first plurality of channels, wherein the communicating of the second sets of data via the second plurality of channels is exclusive of any other channels of the bus.

17. The device of claim 16, wherein the buffer is operable to, when in a third configuration, communicate the second sets of data having the second width via a third plurality of channels.

18. The device of claim 17, wherein the buffer is operable to, in a fourth configuration, communicate third sets of data having a third width via a fourth plurality of channels.

19. The device of claim 16, further comprising:
a decoder operable to receive, in the second configuration, a read command for a memory address,
wherein the buffer is operable to, in the second configuration and in response to the read command:
prefetch data having a third width from the memory address, wherein the third width is common to prefetches for read commands in the first configuration and the second configuration;
convert the data having the first width into multiple sets of data having the second width; and
transmit the multiple sets of data having the second width sequentially to the host device over the second plurality of channels.

20. The device of claim 16, further comprising:
a decoder operable to receive, in the second configuration, a write command for a memory address,
wherein the buffer is operable to, in the second configuration for the write command:
receive multiple sets of data having the second width sequentially over the second plurality of channels;
combine the multiple sets of data having the second width into data having a third width; and
write the data having the third width to the memory array at the memory address.

21. The device of claim 16, wherein the circuitry is operable to:
detect an error condition for communication via at least one of the plurality of pins; and
transmit, to the host device, an indication of the error condition for the at least one of the plurality of pins.

22. The device of claim 21, wherein the error condition comprises an open or a shorted condition for the at least one of the plurality of pins.

23. The device of claim 21, wherein the error condition comprises a cross-coupled condition for the at least one of the plurality of pins.

24. The device of claim 16, further comprising:
a switch coupled with the plurality of pins and the buffer, the switch operable to, in the first configuration, connect the plurality of pins to the buffer, and to, in the second configuration, connect a subset of the plurality of pins to the buffer.

25. The device of claim 24, wherein the switch is operable to, in a third configuration, connect a second subset of the plurality of pins to the buffer.

26. The device of claim 25, wherein at least one of the subset or the second subset of the plurality of pins comprises a first pin having a first index and a second pin having a second index, and excludes a third pin having a third index that is greater than the first index and less than the second index.

* * * * *